United States Patent

Yamaguchi et al.

(10) Patent No.: US 9,007,542 B2
(45) Date of Patent: Apr. 14, 2015

(54) THIN-FILM TRANSISTOR ARRAY SUBSTRATE, METHOD OF MANUFACTURING SAME AND LIQUID CRYSTAL DISPLAY DEVICE

(71) Applicant: NLT Technologies, Ltd., Kanagawa (JP)

(72) Inventors: Hirotaka Yamaguchi, Kanagawa (JP); Kenichi Takatori, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 32 days.

(21) Appl. No.: 13/960,111

(22) Filed: Aug. 6, 2013

(65) Prior Publication Data

US 2013/0321733 A1     Dec. 5, 2013

Related U.S. Application Data

(62) Division of application No. 12/693,771, filed on Jan. 26, 2010, now Pat. No. 8,537,297.

(30) Foreign Application Priority Data

Jan. 26, 2009     (JP) ................................ 2009-014725

(51) Int. Cl.
*G02F 1/136* (2006.01)
*H01L 27/12* (2006.01)
*G02F 1/1362* (2006.01)
*H01L 29/786* (2006.01)

(52) U.S. Cl.
CPC ...... *H01L 27/1248* (2013.01); *G02F 1/136227* (2013.01); *H01L 27/1225* (2013.01); *H01L 29/78681* (2013.01); *H01L 29/7869* (2013.01); *H01L 27/127* (2013.01)

(58) Field of Classification Search
CPC ............................... G02F 1/1368; H01L 33/08
USPC ................................................. 349/38, 42, 43
See application file for complete search history.

(56) References Cited

U.S. PATENT DOCUMENTS

| 6,097,466 | A | * | 8/2000 | Koma | 349/143 |
| 6,335,717 | B2 | * | 1/2002 | Hasegawa et al. | 345/97 |
| 6,982,776 | B2 | | 1/2006 | Nagano et al. | |

(Continued)

FOREIGN PATENT DOCUMENTS

| JP | 9-152597 | 6/1997 |
| JP | 2003-177384 | 6/2003 |

(Continued)

OTHER PUBLICATIONS

Office Action issued Jan. 22, 2013 by the Japanese Patent Office in Japanese Patent Application No. 2009-014725, 2 pages.

*Primary Examiner* — Lucy Chien
(74) *Attorney, Agent, or Firm* — Young & Thompson

(57) ABSTRACT

A vertically aligned thin-film transistor array substrate in which there is no reduction in aperture ratio includes an etching-stop layer formed on an insulating layer; a passivation layer formed on the insulating layer that includes the etching-stop layer; a depression formed in the passivation layer and hollowing the passivation layer to the surface of the etching-stop layer; and a pixel electrode, which is recessed in conformity with the depression, formed on the passivation layer that includes the depression; wherein the etching-stop layer comprises a transparent semiconductor.

13 Claims, 24 Drawing Sheets

(56) References Cited

U.S. PATENT DOCUMENTS

| | | |
|---|---|---|
| 7,113,241 B2 * | 9/2006 | Hanaoka .................. 349/139 |
| 2001/0002855 A1 * | 6/2001 | Onisawa et al. ............. 349/43 |
| 2001/0002857 A1 * | 6/2001 | Shimada et al. ............ 349/138 |
| 2001/0046003 A1 | 11/2001 | Song |
| 2002/0080320 A1 | 6/2002 | Suzuki et al. |
| 2006/0187371 A1 | 8/2006 | Nakayoshi et al. |
| 2006/0197898 A1 | 9/2006 | Kurasawa |

FOREIGN PATENT DOCUMENTS

| | | |
|---|---|---|
| JP | 2004-212532 | 7/2004 |
| JP | 2006-243494 | 9/2006 |
| WO | WO 2006/117929 | 11/2006 |
| WO | WO 2007/015457 | 2/2007 |

\* cited by examiner

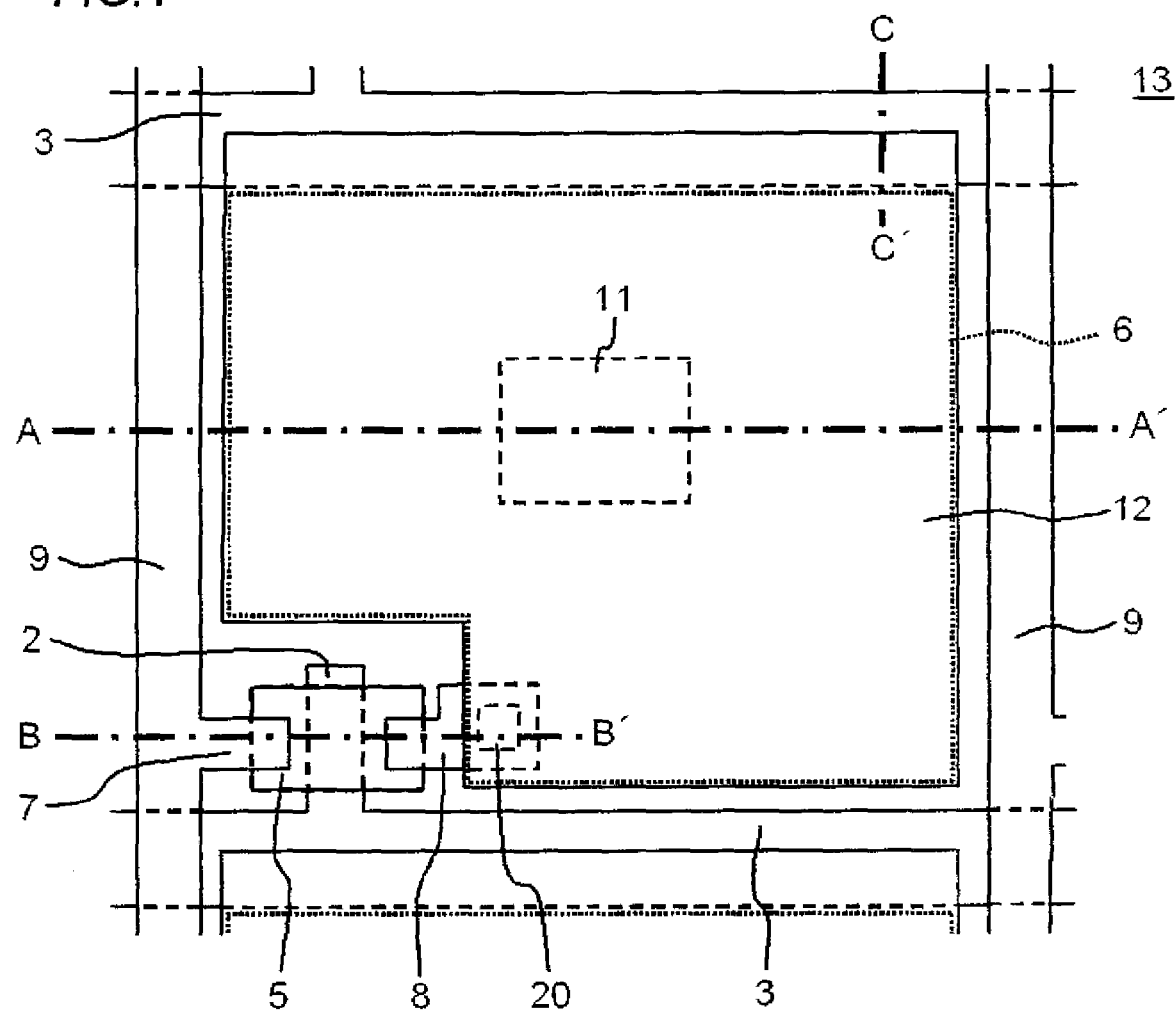
FIG.1 (FIRST EXEMPLARY EMBODIMENT)

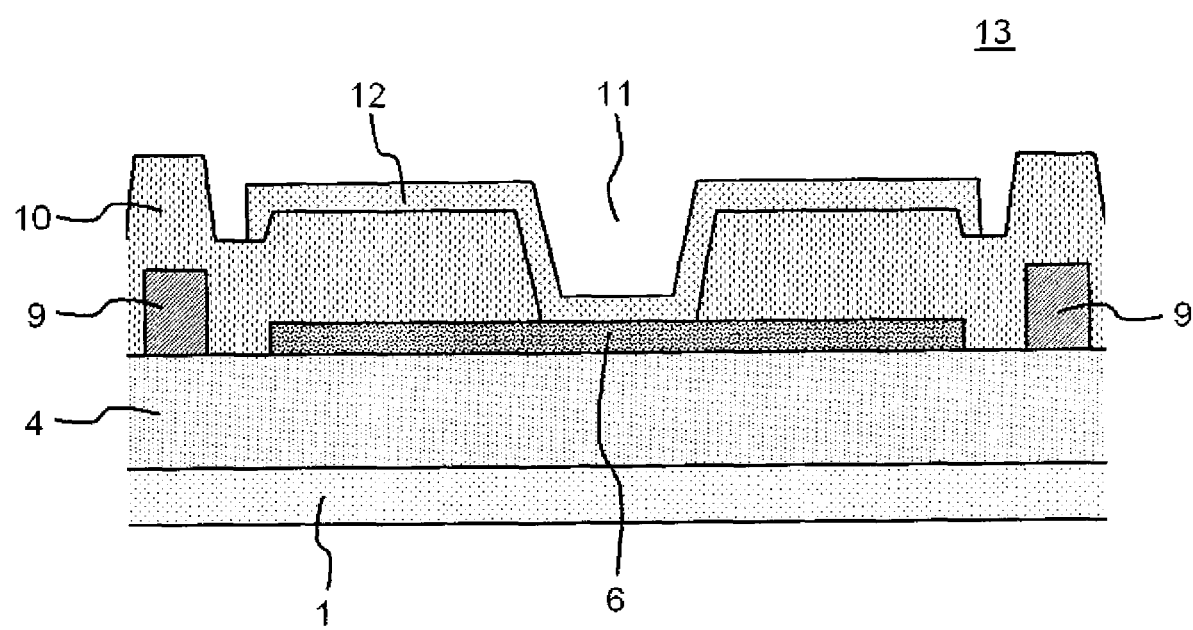
FIG.2 (FIRST EXEMPLARY EMBODIMENT) A–A'

FIG.3 (FIRST EXEMPLARY EMBODIMENT) B−B'
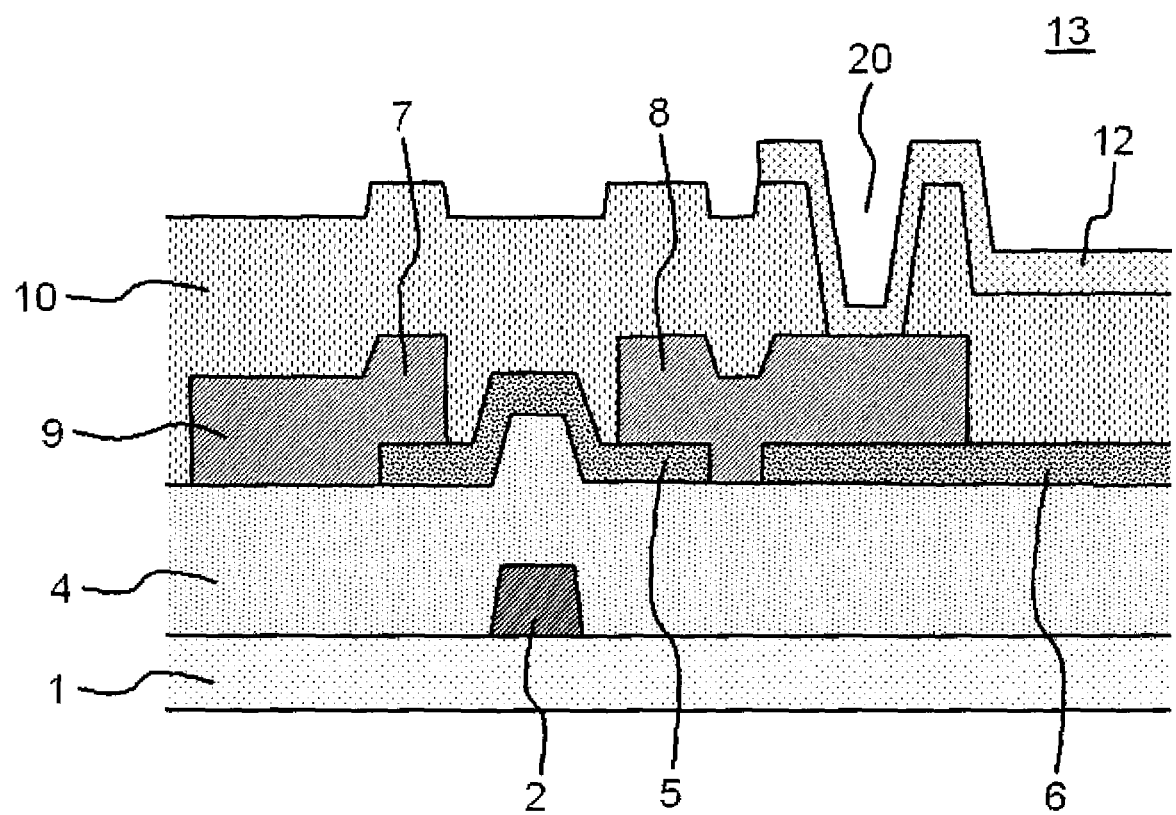

FIG.4 (FIRST EXEMPLARY EMBODIMENT)
C-C'
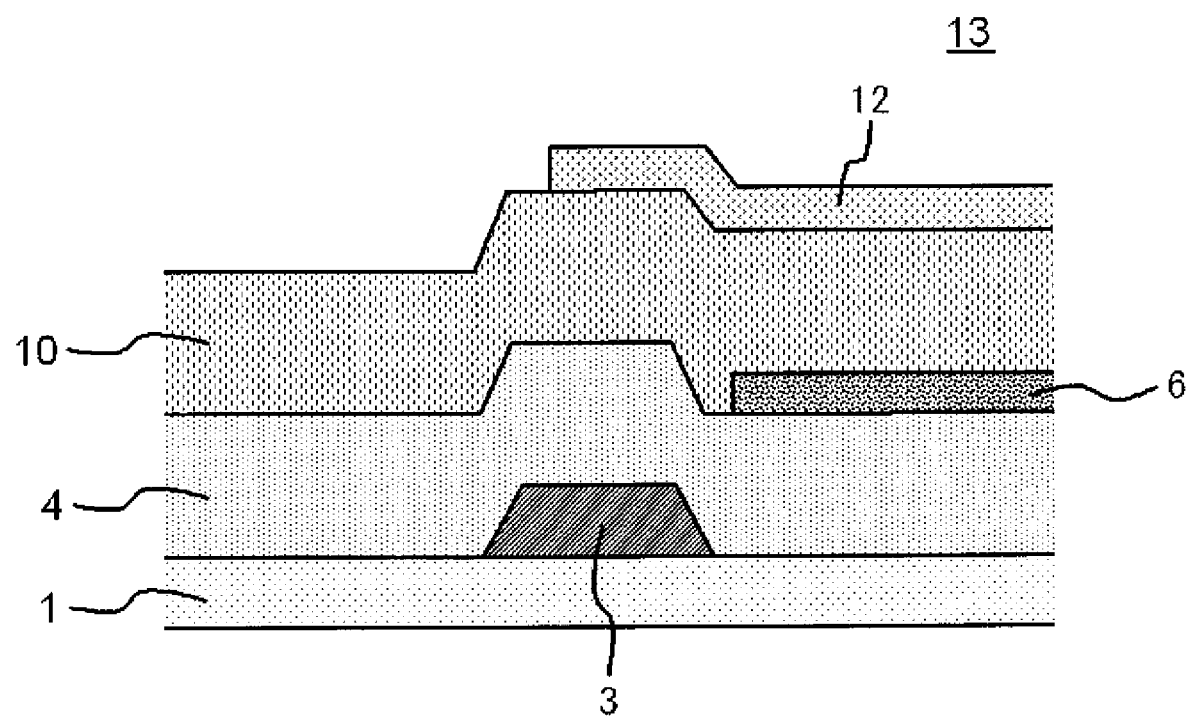

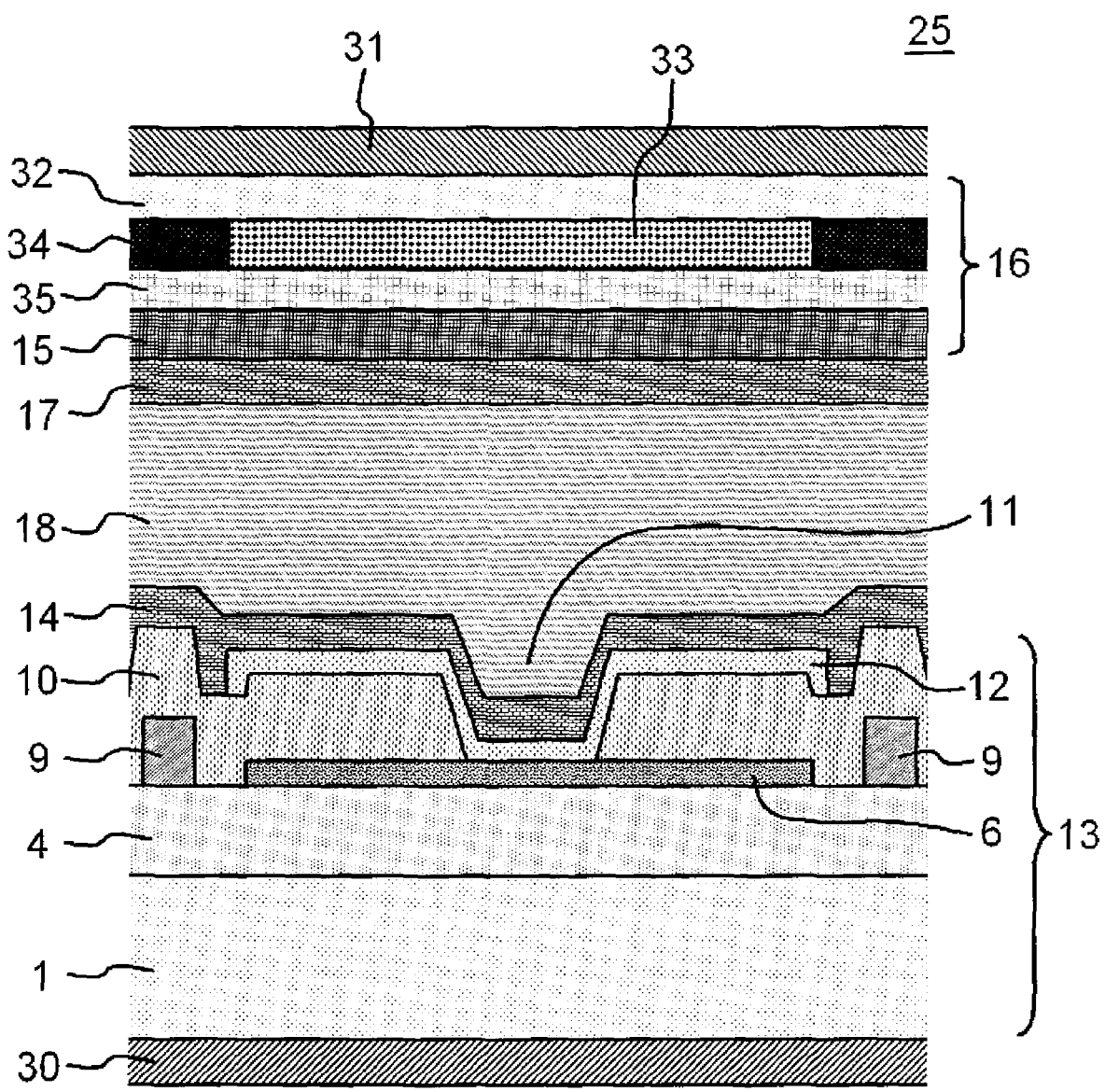
FIG.5  (FIRST EXEMPLARY EMBODIMENT)
A–A'

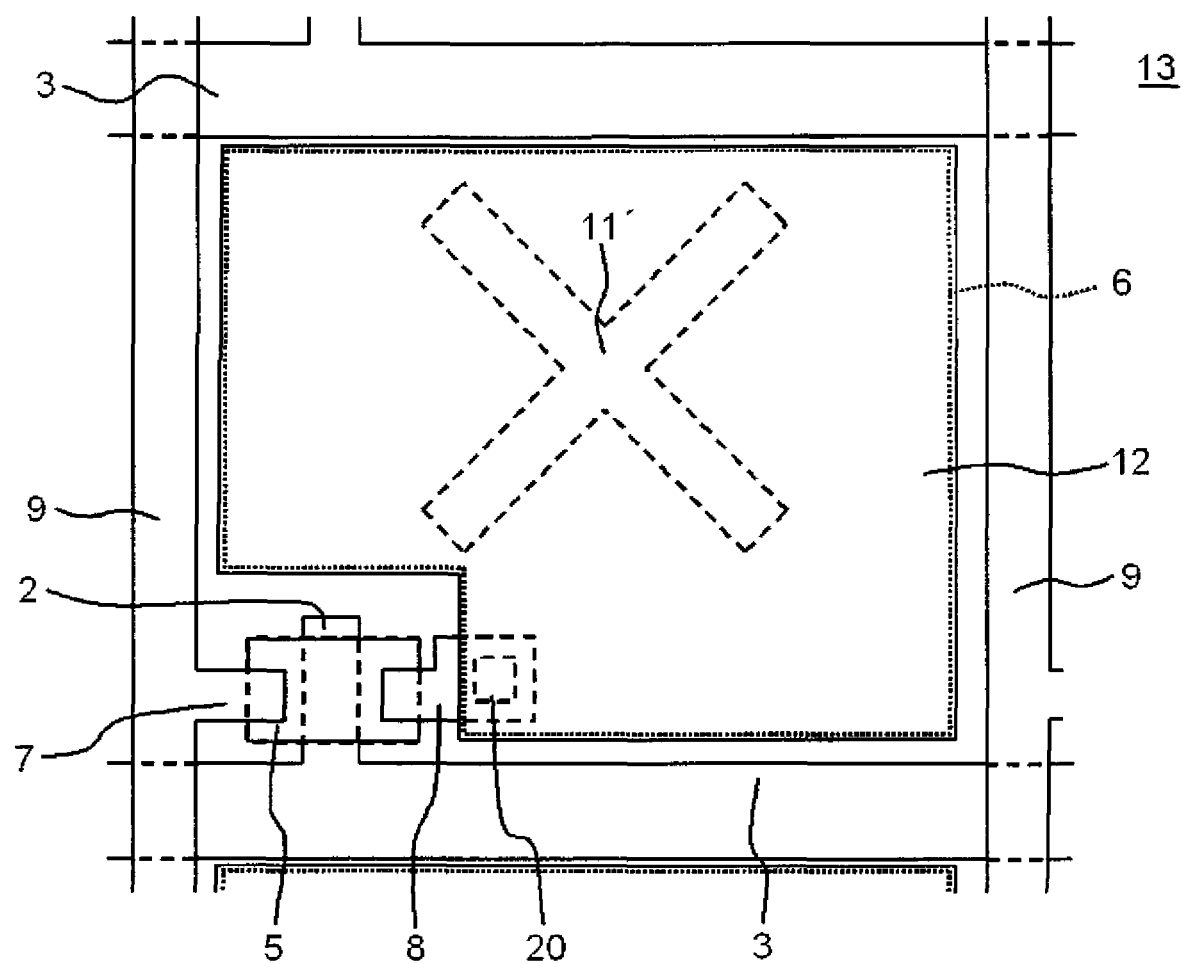
FIG.6 (FIRST EXEMPLARY EMBODIMENT) MODIFICATION

FIG.7A (FIRST EXEMPLARY EMBODIMENT)
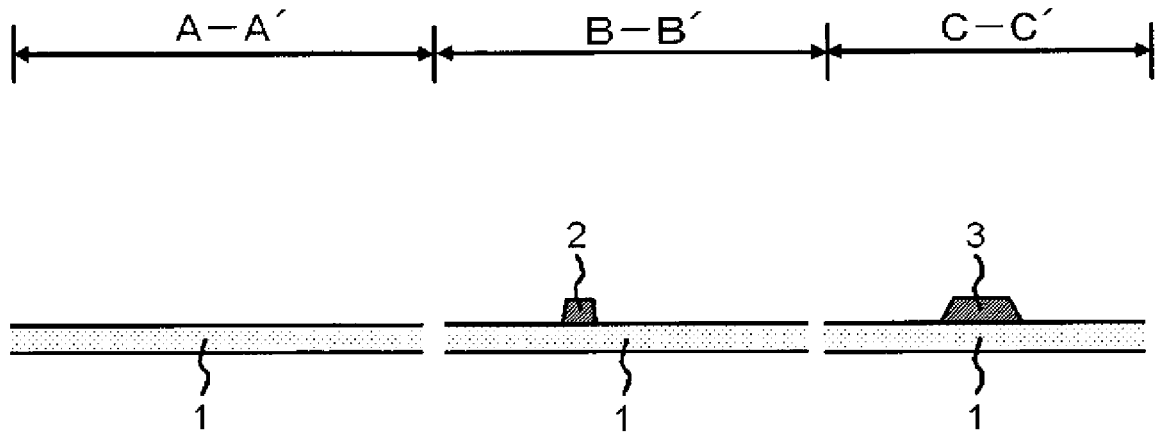
FIG.7B
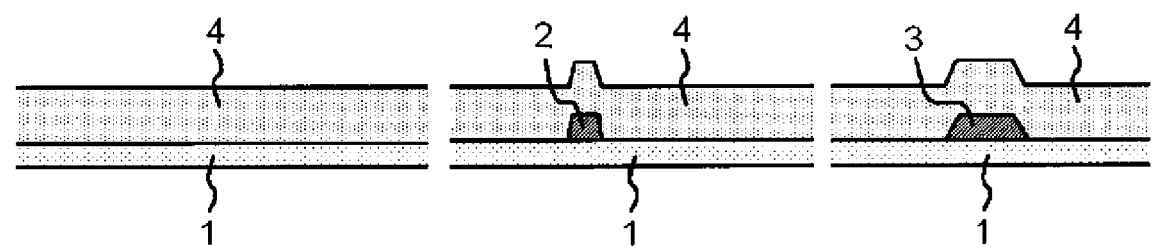
FIG.7C
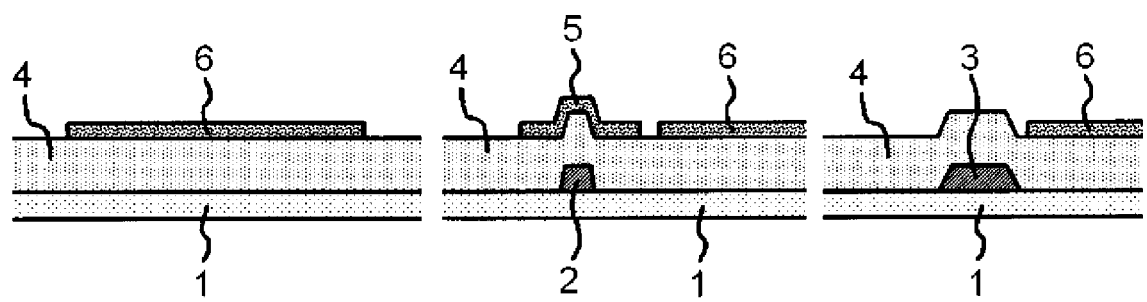

FIG.8A (FIRST EXEMPLARY EMBODIMENT)
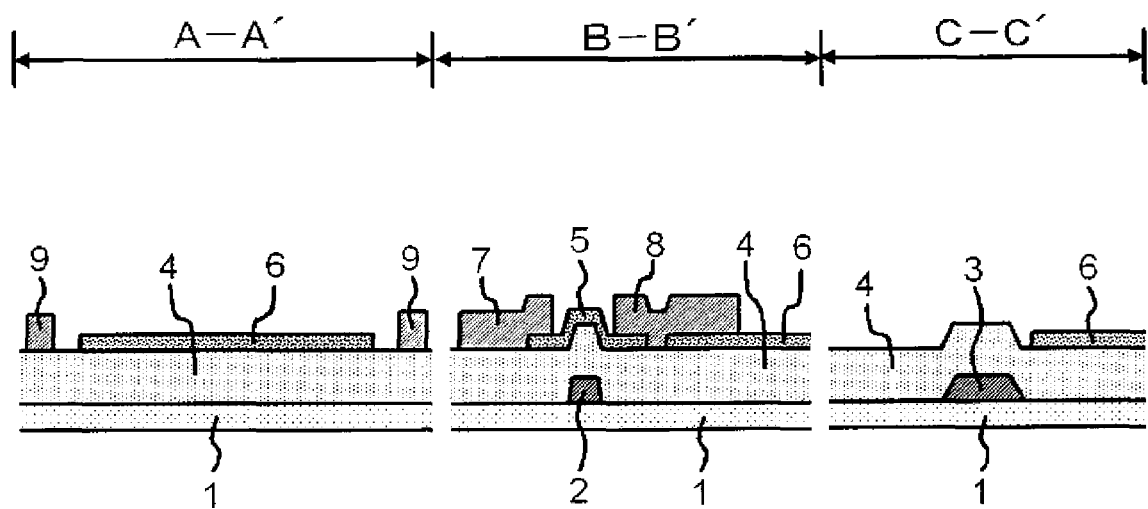
FIG.8B
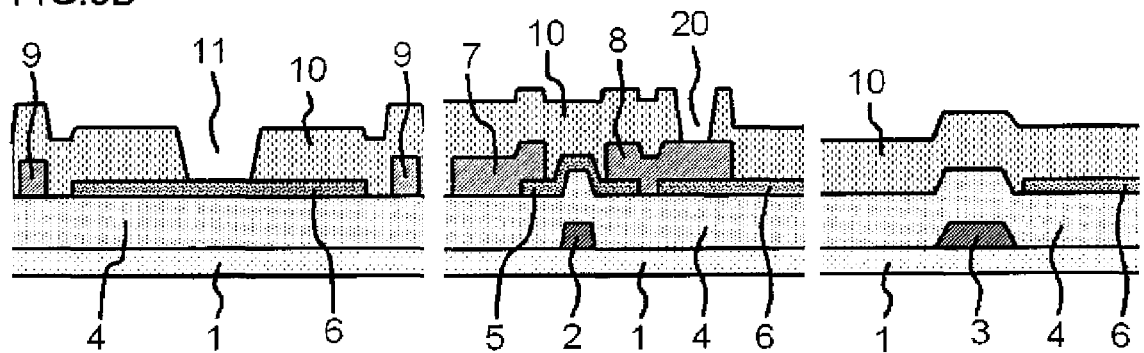
FIG.8C
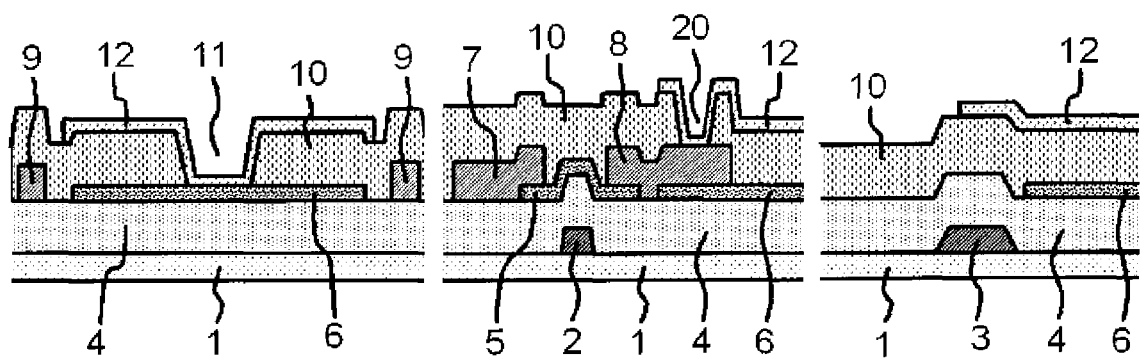

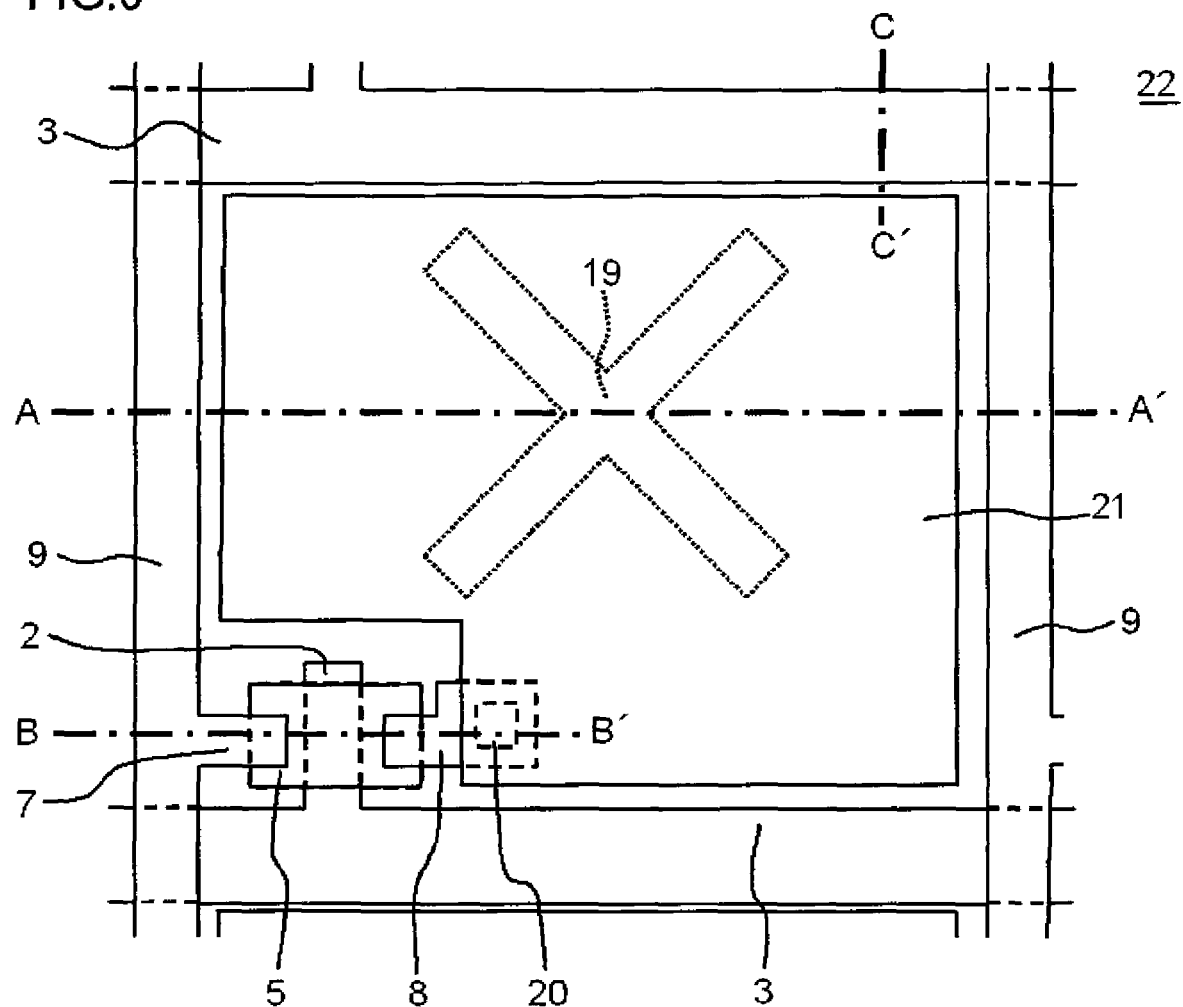
FIG.9 (SECOND EXEMPLARY EMBODIMENT)

FIG.10 (SECOND EXEMPLARY EMBODIMENT) A—A'
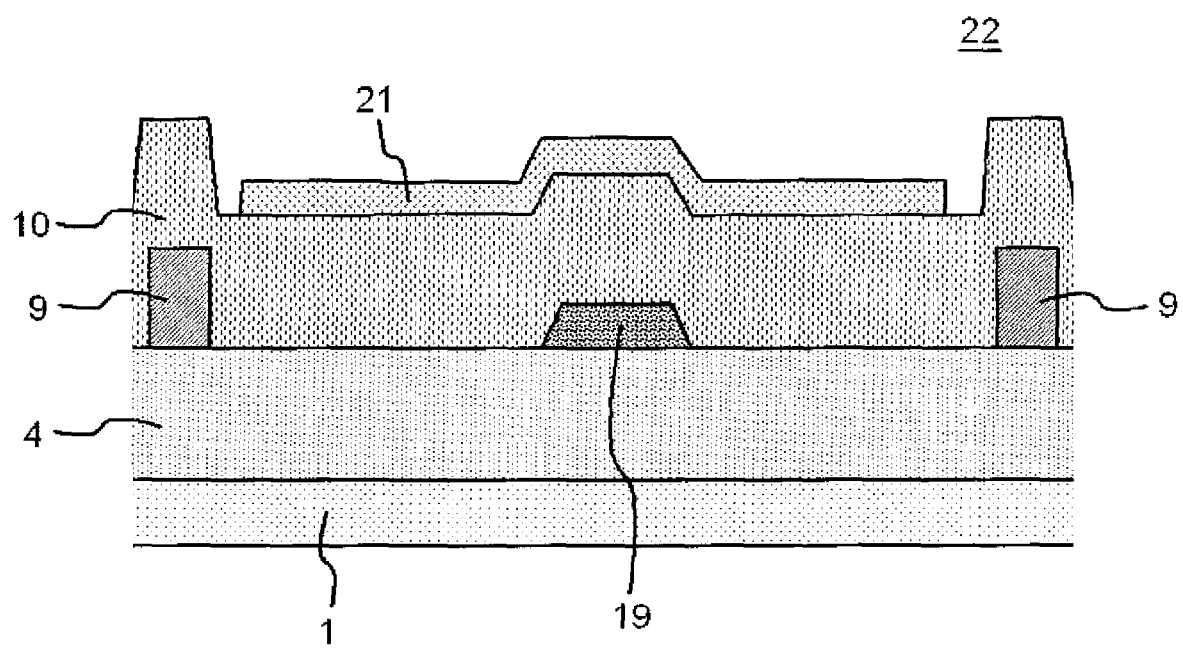

FIG.11 (SECOND EXEMPLARY EMBODIMENT)
B−B'
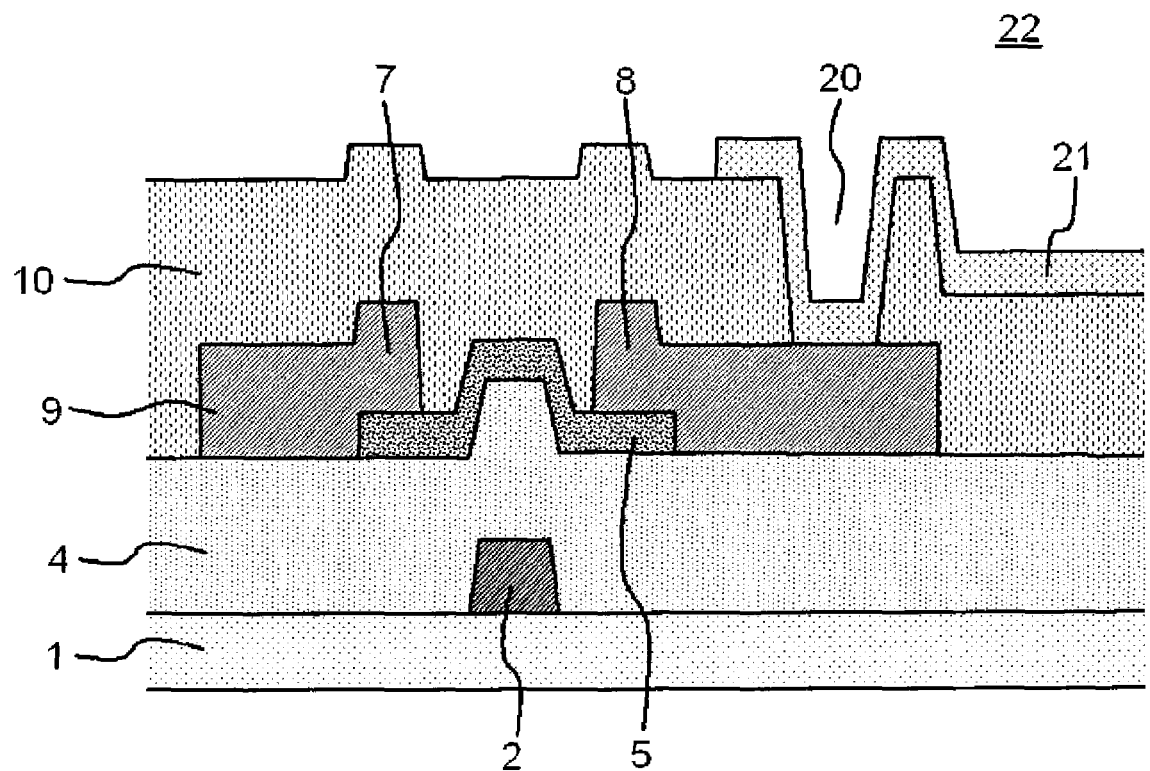

FIG.12 (SECOND EXEMPLARY EMBODIMENT)
C—C'
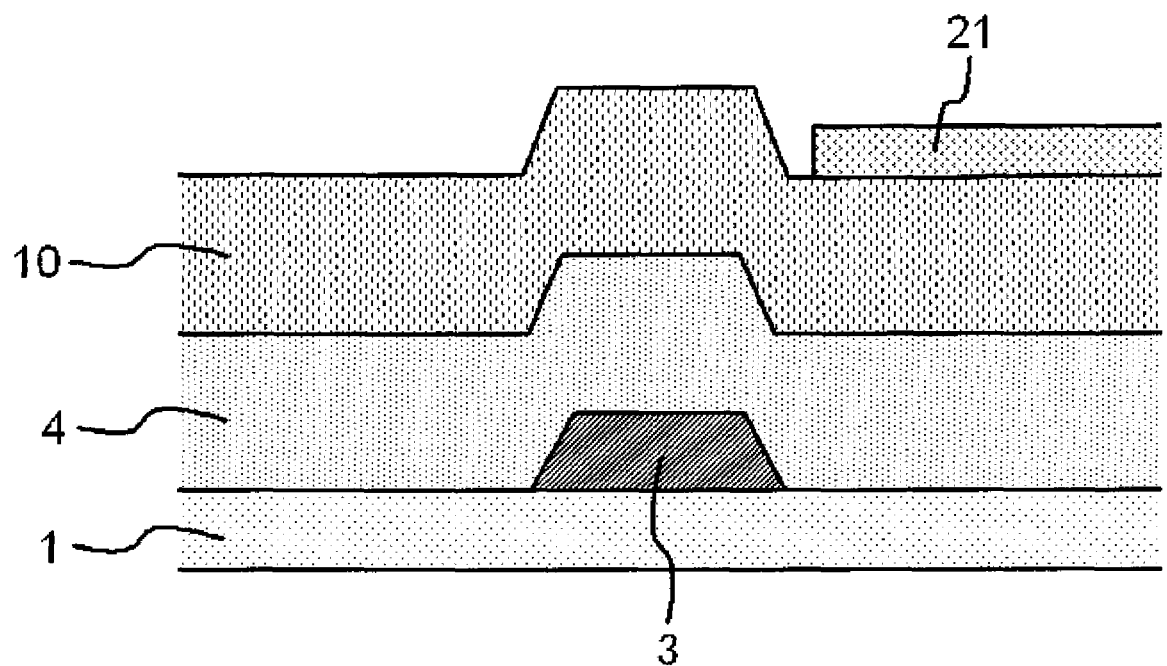

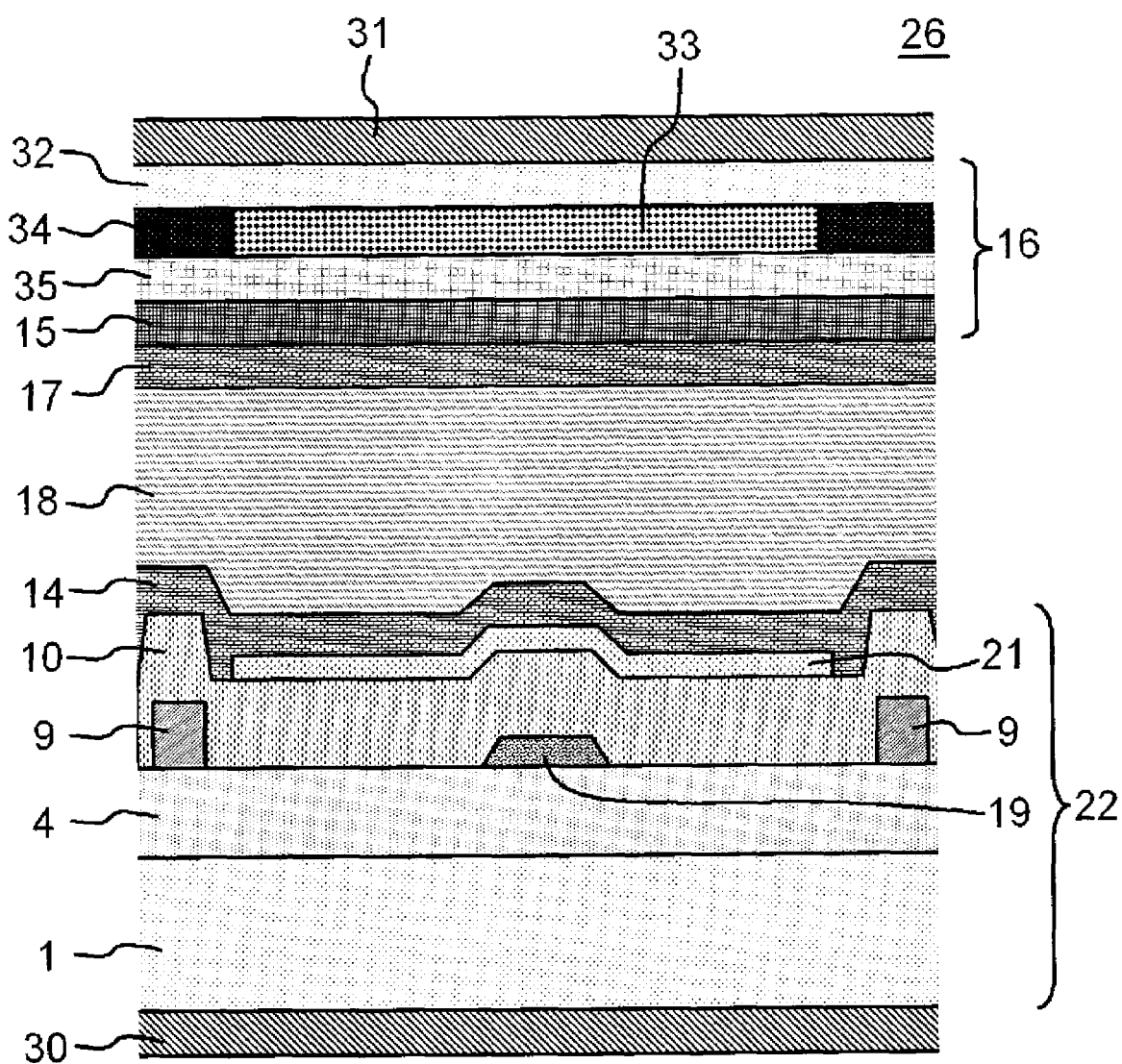
FIG.13 (SECOND EXEMPLARY EMBODIMENT) A–A'

FIG.14A  (SECOND EXEMPLARY EMBODIMENT)
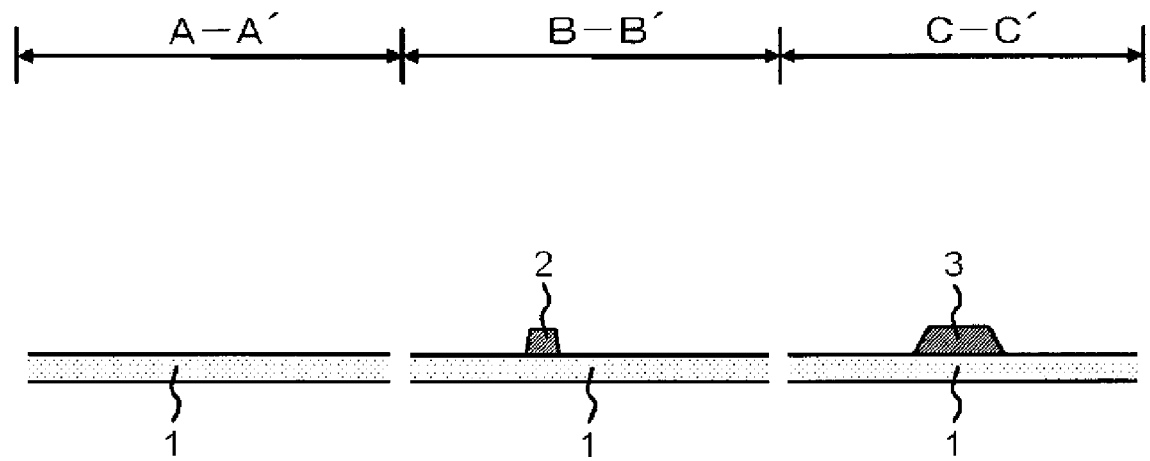
FIG.14B
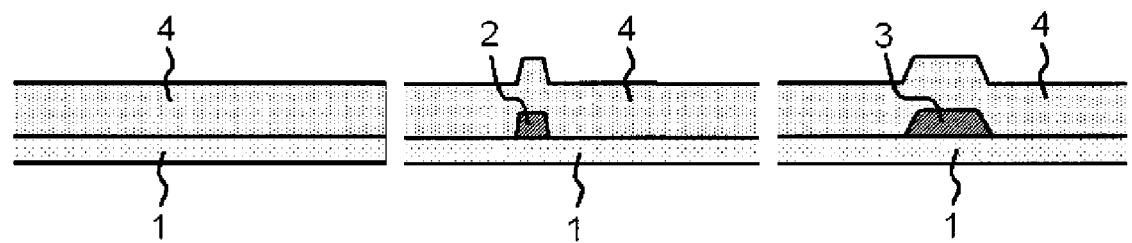
FIG.14C
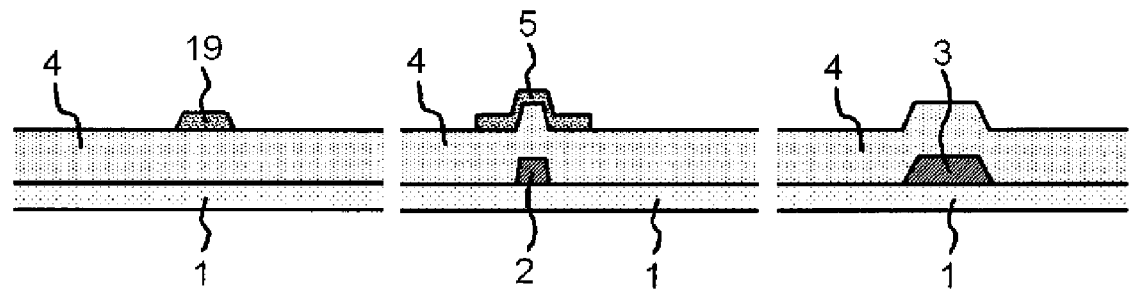

FIG.15A (SECOND EXEMPLARY EMBODIMENT)
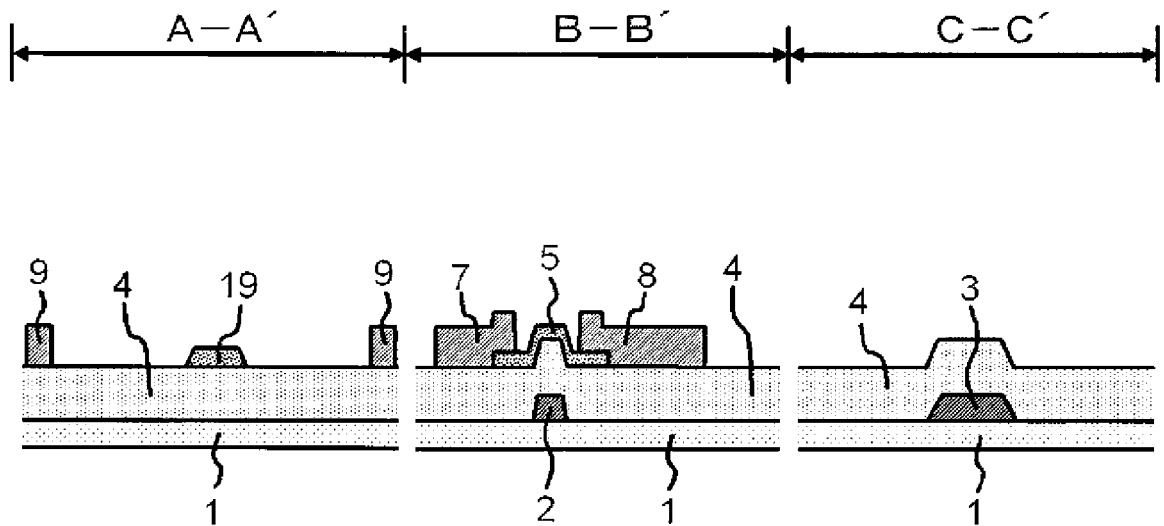
FIG.15B
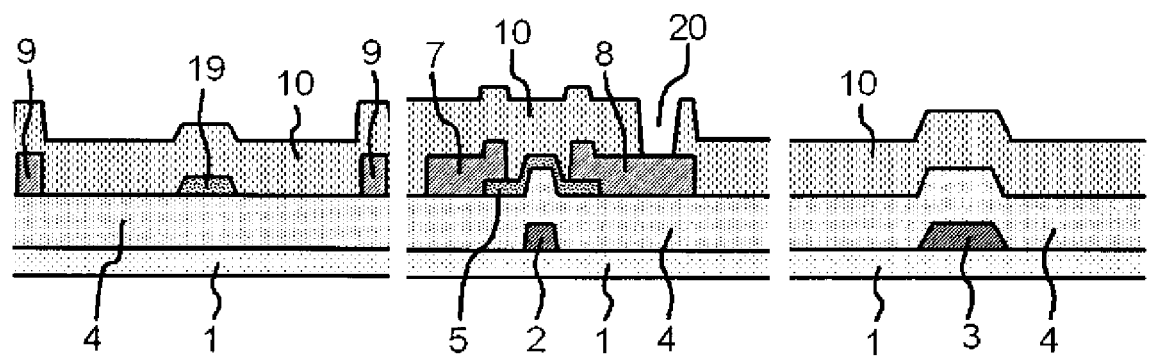
FIG.15C
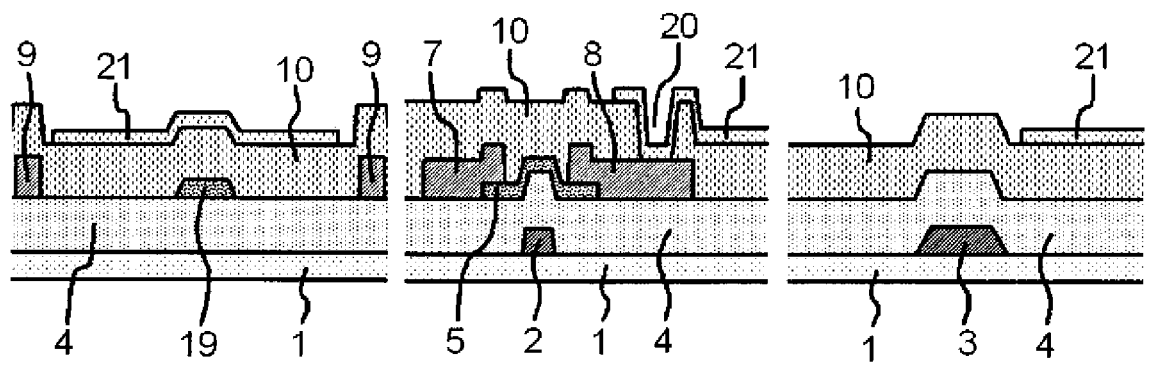

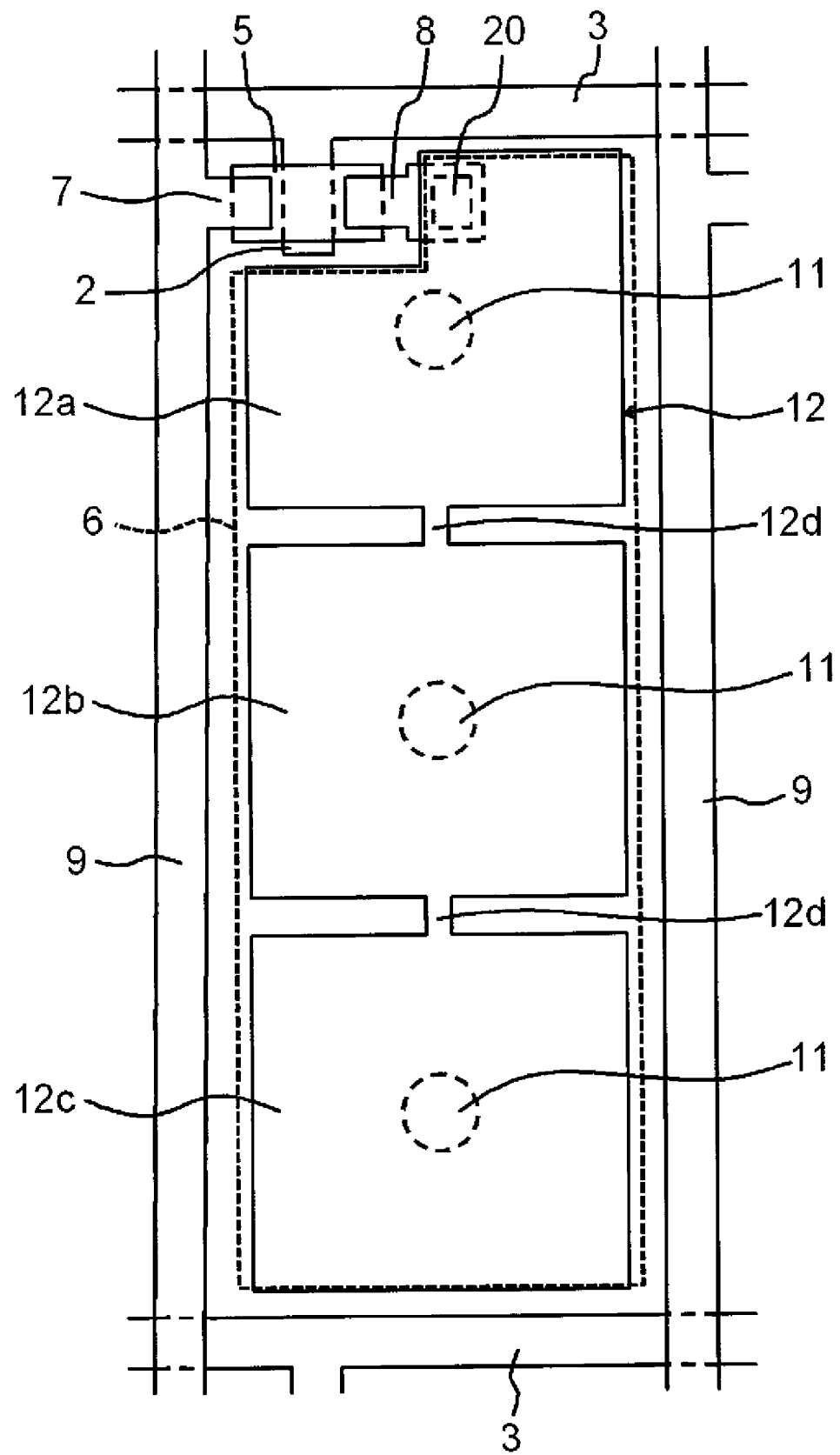
FIG.16 (THIRD EXEMPLARY EMBODIMENT)

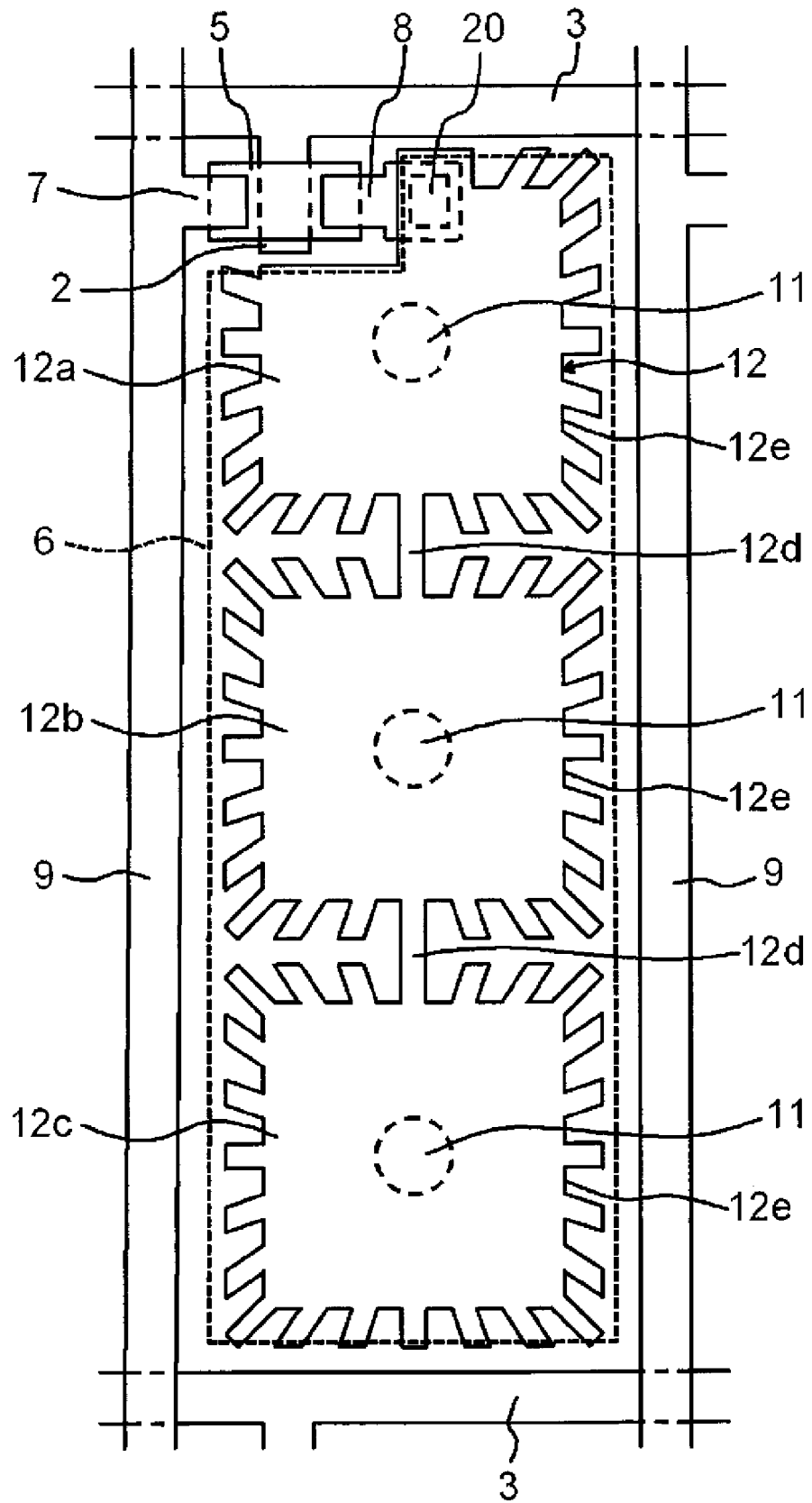
FIG.17 (FOURTH EXEMPLARY EMBODIMENT)

FIG.18 (FIFTH EXEMPLARY EMBODIMENT)
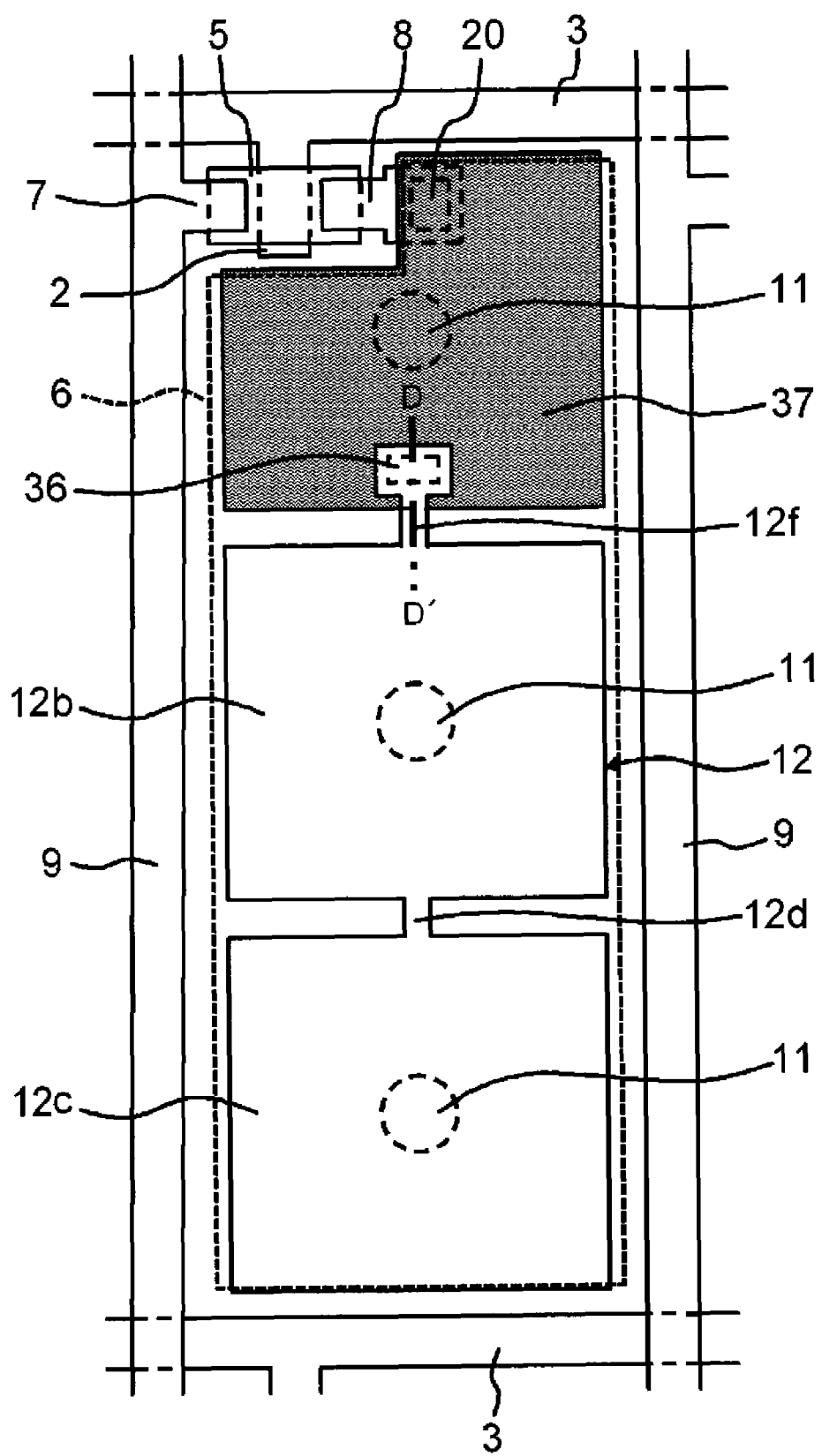

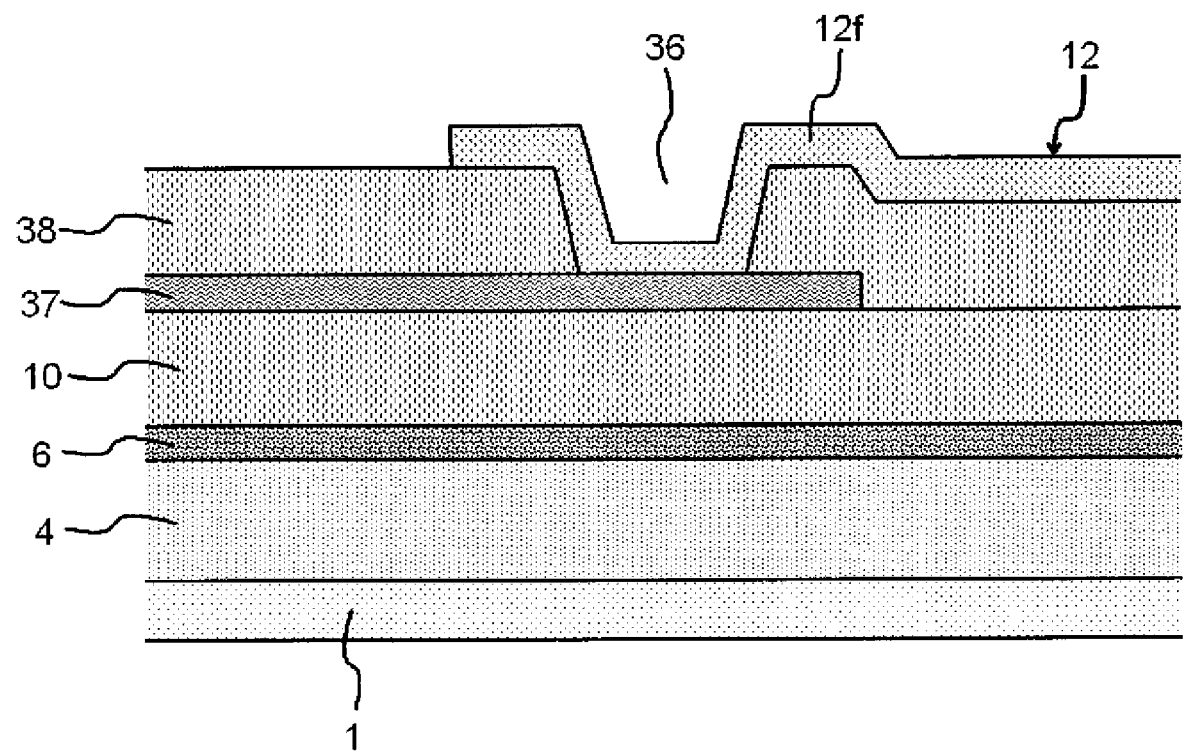
FIG.19 (FIFTH EXEMPLARY EMBODIMENT) D-D'

FIG.20 (EXAMPLE 5-1)
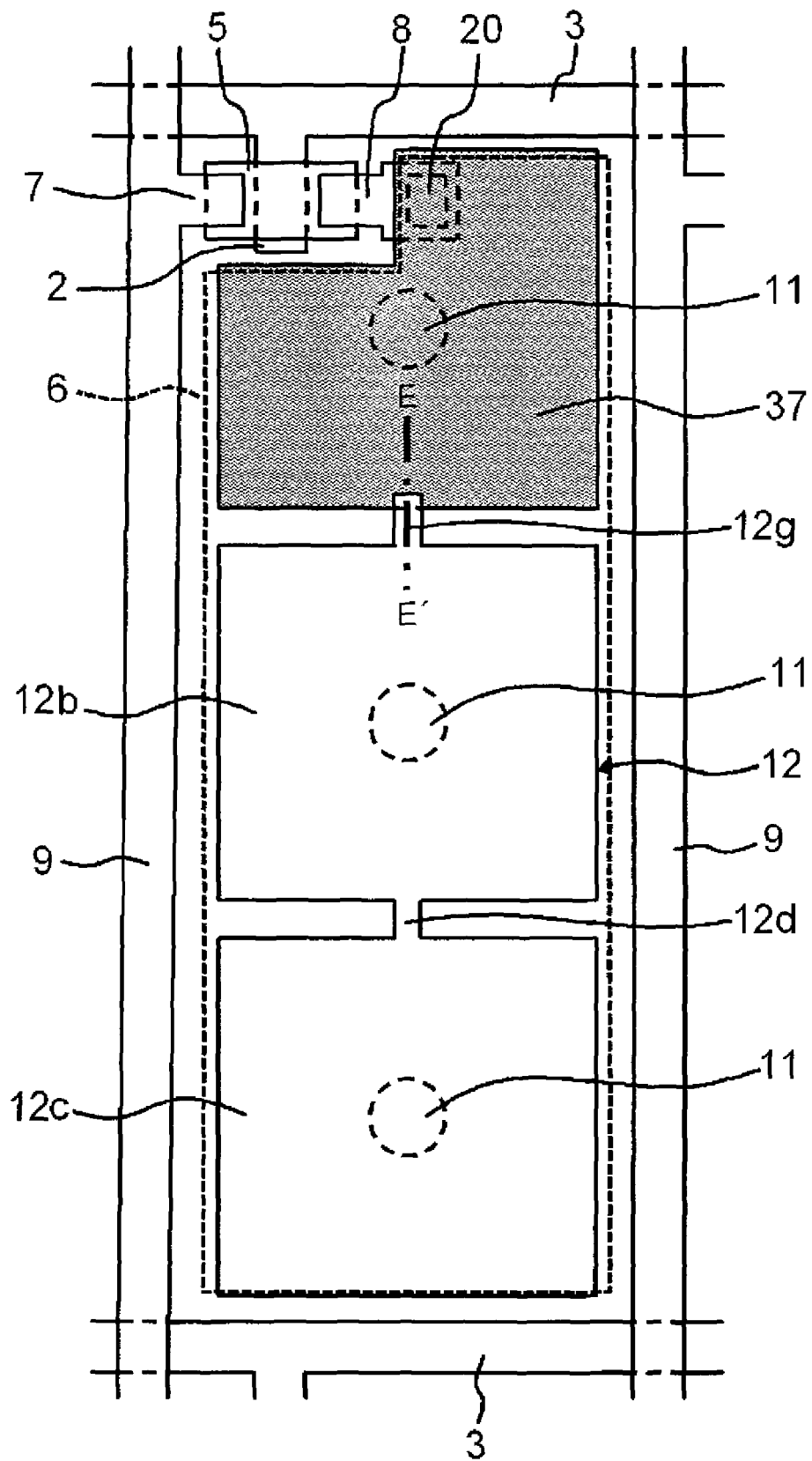

(EXAMPLE 5-1)
E−E'

FIG.23 (EXAMPLE 5-3)

THIN-FILM TRANSISTOR ARRAY SUBSTRATE, METHOD OF MANUFACTURING SAME AND LIQUID CRYSTAL DISPLAY DEVICE

CROSS REFERENCE TO RELATED APPLICATIONS

This application is a division of application Ser. No. 12/693,771 filed on Jan. 26, 2010.

FIELD OF THE INVENTION

Reference to Related Application

This application claims the benefit of the priority of Japanese Patent Application No. 2009-014725 filed on Jan. 26, 2009, the entire disclosure thereof being incorporated herein by reference thereto.

This invention relates to a thin-film transistor array substrate, a method of manufacturing the substrate and a liquid crystal display device having the substrate.

BACKGROUND

An active-matrix drive liquid crystal display device using thin-film transistor (TFTs) has a structure in which liquid crystal is sandwiched between two opposing substrates, namely a TFT array substrate in which a plurality of TFTs and a plurality of pixel electrodes are formed in a matrix array, and a color filter substrate covered by counter electrodes. For example, a conventional liquid crystal display device described in Patent Document 1 is a vertically aligned liquid crystal display device that includes a glass substrate 110; a TFT substrate 102 having a TFT 105 formed on the TFT substrate 102 and a pixel electrode 124 connected to the TFT 105; a counter substrate 102a arranged to be opposed to the TFT substrate 102; and a vertically aligned liquid crystal 126 sealed between the TFT substrate 102 and counter substrate 102a (see FIG. 24).

Further, in the liquid crystal display device described in Patent Document 1, depressions 123 where portions of the pixel electrode 124 are recessed are provided within the pixel region in which the pixel electrode 124 of TFT substrate 102 has been formed, and etching-stop patterns 113a, 113b, 113c are formed below the depressions 123. When a voltage is applied across the pixel electrode 124 and a common electrode 136, the liquid crystal molecules in the vertically aligned liquid crystal 126 become aligned in a direction perpendicular to the electric field. By forming the depressions 123, therefore, the directions of alignment of the liquid crystal molecules become different from one another radially outward from the depressions 123 and multi-domains are achieved. Further, by forming the etching-stop patterns 113a, 113b, 113c, etching is not allowed to progress owing to the etching-stop patterns 113a, 113b, 113c when the depressions 123 are formed by etching and a decline in the strength of the glass substrate 110 is prevented.

[Patent Document 1] Japanese Patent Kokai Publication No. 2006-243494A

However, with the liquid crystal display device described in Patent Document 1, the etching-stop patterns 113a, 113b, 113c are made of metal (e.g., laminated films of aluminum and titanium) and light cannot pass through them. The result is a small aperture ratio. (If a pixel is divided into a portion that transmits light and a portion that does not, the aperture ratio is the area ratio of the portion that transmits light). Thus, there is much to be desired in the art.

It is an object of the present invention to provide a vertically aligned thin-film transistor array substrate that does not result in a reduced aperture ratio, a method of manufacturing the substrate and a liquid crystal display device having the substrate.

According to a first aspect of the present invention, there is provided a thin-film transistor array substrate comprising: an etching-stop layer formed on an insulating layer; a passivation layer formed on the insulating layer that includes the etching-stop layer; a depression formed in the passivation layer and hollowing the passivation layer to the surface of the etching-stop layer; and a pixel electrode, which is recessed in conformity with the depression, formed on the passivation layer including the depression; wherein the etching-stop layer comprises a transparent semiconductor.

According to a second aspect of the present invention, there is provided a thin-film transistor array substrate comprising: a pixel protrusion formed on an insulating layer; a passivation layer formed on the insulating layer that including the pixel protrusion and having a first projecting portion corresponding to the pixel protrusion; and a pixel electrode formed on the passivation layer including the first projecting portion and having a second projecting portion corresponding to the first projecting portion; wherein the pixel protrusion comprises a transparent semiconductor.

According to a third aspect of the present invention, there is provided a liquid crystal display device comprising the above-described thin-film transistor array substrate; a color filter substrate; and a liquid crystal layer interposed between the thin-film transistor substrate array and the color filter substrate.

According to a fourth aspect of the present invention, there is provided a method of manufacturing a thin-film transistor array substrate comprising: forming a gate electrode and a scanning line on a transparent insulating substrate; forming an insulating layer on the transparent insulating substrate that includes the gate electrode and the scanning line; and forming a transparent semiconductor layer on the insulating layer in an area which will become a channel of the gate electrode, and simultaneously forming on the insulating layer an etching-stop layer consisting of a material identical with that of the transparent semiconductor layer. The method further comprises: forming at least a drain electrode, a source electrode and a signal line on the insulating layer; forming a passivation layer on the insulating layer that includes the transparent semiconductor layer, the etching-stop layer, the signal line, the drain electrode and the source electrode; and forming a depression, which hollows the passivation layer to the surface of the etching-stop layer, in the passivation layer, and simultaneously forming a contact hole that communicates with the source electrode. The method further comprises: forming a pixel electrode on the passivation layer that includes areas of the depression and the contact hole.

According to a fifth aspect of the present invention, there is provided a method of manufacturing a thin-film transistor array substrate comprising: forming a gate electrode and a scanning line on a transparent insulating substrate; forming an insulating layer on the transparent insulating substrate that includes the gate electrode and the scanning line; and forming a transparent semiconductor layer on the insulating layer in an area which will become a channel of the gate electrode, and simultaneously forming on the insulating layer a pixel protrusion consisting of a material identical with that of the transparent semiconductor layer. The method further comprises: forming at least a drain electrode, a source electrode and a signal line on the insulating layer; forming a passivation layer on the insulating layer that includes the transparent semiconductor layer, the pixel protrusion, the signal line, the drain electrode and the source electrode; and forming a contact hole, which communicates with the source electrode, in the passivation layer. The method further comprises: forming a pixel electrode on the passivation layer that includes areas of the pixel protrusion and the contact hole.

In accordance with the present invention (first and third aspects), the etching-stop layer in the pixel region is transparent. As a result, the aperture ratio (the area ratio of the portion that transmits light in a case where a pixel is divided into a portion that transmits light and a portion that does not) can be enlarged and a liquid crystal display device exhibiting an excellent display characteristic is obtained.

In accordance with the present invention (second and third aspects), the pixel protrusion in the pixel region is transparent. As a result, the aperture ratio (the portion that transmits light in a case where a pixel is divided into a portion that transmits light and a portion that does not) can be enlarged and a liquid crystal display device exhibiting an excellent display characteristic is obtained.

In accordance with the present invention (fourth aspect), the etching-stop layer can be formed at the same time as the transparent semiconductor layer of the thin-film transistor. As a result, there is no increase in photoresist-forming steps and no increase in device manufacturing cost.

In accordance with the present invention (fifth aspect), the pixel protrusion can be formed at the same time as the transparent semiconductor layer of the thin-film transistor. As a result, there is no increase in photoresist-forming steps and no increase in device manufacturing cost.

BRIEF DESCRIPTION OF THE DRAWINGS

FIG. 1 is a partial plan view schematically illustrating the structure of the pixel portion of a thin-film transistor array substrate according to a first exemplary embodiment of the present invention;

FIG. 2 is a sectional view taken along line A-A' of FIG. 1 schematically illustrating the structure of the pixel portion of a thin-film transistor array substrate according to the first exemplary embodiment of the present invention;

FIG. 3 is a sectional view taken along line B-B' of FIG. 1 schematically illustrating the structure of the pixel portion of a thin-film transistor array substrate according to the first exemplary embodiment of the present invention;

FIG. 4 is a sectional view taken along line C-C' of FIG. 1 schematically illustrating the structure of the pixel portion of a thin-film transistor array substrate according to the first exemplary embodiment of the present invention;

FIG. 5 is a sectional view corresponding to line A-A' of FIG. 1 schematically illustrating the structure of the pixel portion of a liquid crystal display device using a thin-film transistor array substrate according to the first exemplary embodiment of the present invention;

FIG. 6 is a partial plan view schematically illustrating a modification of the structure of the pixel portion of a thin-film transistor array substrate according to the first exemplary embodiment of the present invention;

FIGS. 7A to 7C are first-process sectional views schematically illustrating a method of manufacturing a thin-film transistor array substrate according to the first exemplary embodiment of the present invention;

FIGS. 8A to 8C are second-process sectional views schematically illustrating a method of manufacturing a thin-film transistor array substrate according to the first exemplary embodiment of the present invention;

FIG. 9 is a partial plan view schematically illustrating the structure of the pixel portion of a thin-film transistor array substrate according to a second exemplary embodiment of the present invention;

FIG. 10 is a sectional view taken along line A-A' of FIG. 9 schematically illustrating the structure of the pixel portion of a thin-film transistor array substrate according to the second exemplary embodiment of the present invention;

FIG. 11 is a sectional view taken along line B-B' of FIG. 9 schematically illustrating the structure of the pixel portion of a thin-film transistor array substrate according to the second exemplary embodiment of the present invention;

FIG. 12 is a sectional view taken along line C-C' of FIG. 9 schematically illustrating the structure of the pixel portion of a thin-film transistor array substrate according to the second exemplary embodiment of the present invention;

FIG. 13 is a sectional view corresponding to line A-A' of FIG. 1 schematically illustrating the structure of the pixel portion of a liquid crystal display device using a thin-film transistor array substrate according to the second exemplary embodiment of the present invention;

FIGS. 14A to 14C are first-process sectional views schematically illustrating a method of manufacturing a thin-film transistor array substrate according to the second exemplary embodiment of the present invention;

FIGS. 15A to 15C are second-process sectional views schematically illustrating a method of manufacturing a thin-film transistor array substrate according to the second exemplary embodiment of the present invention;

FIG. 16 is a partial plan view schematically illustrating the structure of the pixel portion of a thin-film transistor array substrate according to a third exemplary embodiment of the present invention;

FIG. 17 is a partial plan view schematically illustrating the structure of the pixel portion of a thin-film transistor array substrate according to a fourth exemplary embodiment of the present invention;

FIG. 18 is a partial plan view schematically illustrating the structure of the pixel portion of a thin-film transistor array substrate according to a fifth exemplary embodiment of the present invention;

FIG. 19 is a sectional view taken along line D-D' of FIG. 18 schematically illustrating the structure of the pixel portion of a thin-film transistor array substrate according to the fifth exemplary embodiment of the present invention;

FIG. 20 is a partial plan view schematically illustrating the structure of the pixel portion of a thin-film transistor array substrate according to an example 5-1 of the present invention;

PREFERRED MODES

Figure 21:
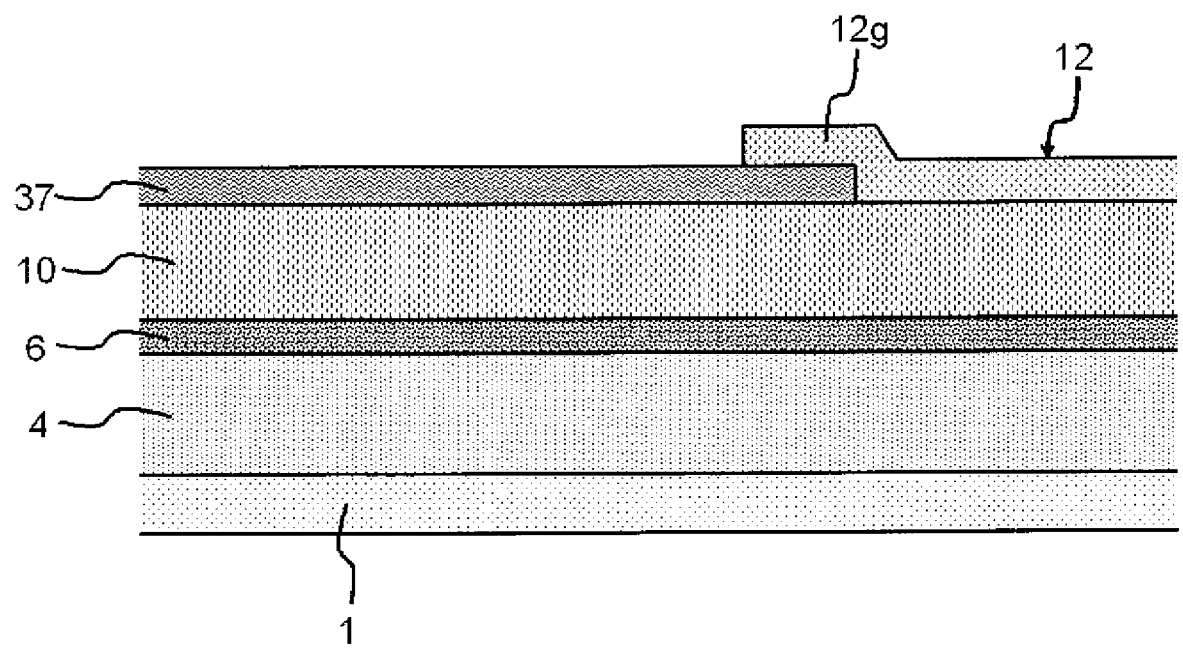
FIG. 21 is a sectional view taken along line E-E' of FIG. 20 schematically illustrating the structure of the pixel portion of a thin-film transistor array substrate according to the example 5-1 of the present invention.

A thin-film transistor array substrate according to a first exemplary embodiment of the present invention comprises an etching-stop layer 6 (FIGS. 1 to 4) formed on an insulating layer 4 (FIGS. 1 to 4); a passivation layer 10 (FIGS. 1 to 4) formed on the insulating layer that includes the etching-stop layer; a depression 11 (FIGS. 1 to 4) formed in the passivation layer and hollowing the passivation layer to the surface of the etching-stop layer; and a pixel electrode 12 (FIGS. 1 to 4), which is recessed in conformity with said depression, formed on the passivation layer that includes the depression; wherein the etching-stop layer comprises a transparent semiconductor.
(Mode 1)

The following modes also are possible:

Preferably, the thin-film transistor array substrate further comprises: a transparent insulating substrate; a scanning line formed on the transparent insulating substrate; a gate electrode formed on the transparent insulating substrate and branching from the scanning line; an insulating layer formed on the transparent insulating substrate on which the gate electrode and the scanning line are formed; a transparent semiconductor layer formed on the insulating layer in an area which will become a channel of the gate electrode; a signal line formed on the insulating layer and intersecting the scanning line; a drain electrode formed on the insulating layer and branching from the signal line and connected to one end of the transparent semiconductor layer; a source electrode formed on the insulating layer, which lies in the same layer as that of the drain electrode, and connected to the other end of the transparent semiconductor layer; and a contact hole formed in the passivation layer and communicating with the source electrode. The etching-stop layer lies in the same layer as that of the transparent semiconductor layer and consists of the same material as that of the transparent semiconductor layer; the passivation layer is formed on the insulating layer that includes the transparent semiconductor layer, the etching-stop layer, the signal line, the drain electrode and the source electrode; the depression is formed in the passivation layer in an area surrounded by the scanning line and the signal line; and the pixel electrode is formed on the passivation layer at least in the area surrounded by the scanning line and the signal line and is electrically connected to the source electrode through the contact hole. (Mode 1-1)

Preferably, the depression is formed into a shape having a plurality of projections extending radially outward from the center. (Mode 1-2)

Preferably, the depression is formed at the center of the area surrounded by the scanning line and signal line. (Mode 1-3)

Preferably, the etching-stop layer is disposed in a region substantially identical with the region of the pixel electrode. (Mode 1-4)

Preferably, the pixel electrode has a structure in which a plurality of subpixel electrodes are joined to one another, and the depression is disposed for every subpixel electrode. (Mode 1-6)

Preferably, the source electrode is formed also on the etching-stop layer and the contact hole is formed in an area where the source electrode and the etching-stop electrode overlap. (Mode 1-5)

A thin-film transistor array substrate according to a second embodiment of the present invention comprises: a pixel protrusion 19 (FIGS. 9 to 12) formed on an insulating layer 4 (FIGS. 9 to 12); a passivation layer 10 (FIGS. 9 to 12) formed on the insulating layer that includes the pixel protrusion and having a projecting portion corresponding to the pixel protrusion; and a pixel electrode 21 (FIGS. 9 to 12) formed on the passivation layer that includes the projecting portion and having a projecting portion corresponding to the projecting portion of the passivation layer; wherein the pixel protrusion comprises a transparent semiconductor.
(Mode 2)

The following modes also are possible:

Preferably, the thin-film transistor array substrate further comprises: a transparent insulating substrate; a scanning line formed on the transparent insulating substrate; a gate electrode formed on the transparent insulating substrate and branching from the scanning line; an insulating layer formed on the transparent insulating substrate that includes the gate electrode and said scanning line; a transparent semiconductor layer formed on the insulating layer in an area which will become a channel of the gate electrode; a signal line formed on the insulating layer and intersecting the scanning line; a drain electrode formed on the insulating layer and branching from the signal line and connected to one end of the transparent semiconductor layer; a source electrode formed on the insulating layer, which lies in the same layer as that of drain electrode, and connected to the other end of the transparent semiconductor layer; and a contact hole formed in the passivation layer and communicating with the source electrode. The pixel protrusion lies in the same layer as that of the transparent semiconductor layer and consists of the same material as that of the transparent semiconductor layer; the passivation layer is formed on the insulating layer that includes the transparent semiconductor layer, the pixel protrusion, the signal line, the drain electrode and the source electrode; and the pixel electrode is formed in the passivation layer at least in an area surrounded by the scanning line and the signal line and is electrically connected to the source electrode through the contact hole. (Mode 2-1)

Preferably, the pixel protrusion is formed into a shape having a plurality of projections extending radially outward from the center. (Mode 2-2)

Preferably, the pixel protrusion is formed at the center of the area surrounded by the scanning line and the signal line. (Mode 2-3)

Preferably, the pixel electrode has a structure in which a plurality of subpixel electrodes are joined to one another, and the pixel protrusion is disposed for every subpixel electrode. (Mode 2-4)

With regard to the first and second embodiments, the following modes also are possible:

Preferably, a portion of the pixel electrode is disposed also in an area overlapped by the scanning line. (Mode 1, 2-1)

Preferably, the pixel electrode is formed to have a plurality of slits in the circumferential portion thereof. (Mode 1, 2-2)

Preferably, the pixel electrode is such that any one of the plurality of subpixel electrodes is a reflective pixel electrode, and the subpixel electrodes other than this one subpixel electrode are transmissive pixel electrodes. (Mode 1, 2-3)

Preferably, the reflective pixel electrode and the transmissive pixel electrode are formed in the same layer. (Mode 1, 2-4)

Preferably, the pixel electrode is a transmissive pixel electrode. (Mode 1, 2-5)

A liquid crystal display device according to a third embodiment of the present invention comprises: the above-described thin-film transistor array substrate 13 (FIG. 5) or 22 (FIG. 13); a color filter substrate 16 (FIGS. 5 and 13); and a liquid crystal layer 18 (FIGS. 5 and 13) interposed between the thin-film transistor substrate array and the color filter substrate.

(Mode 3)

The following mode also is possible:

Preferably, the liquid crystal layer is a layer comprising vertically aligned liquid crystal molecules. (Mode 3-1)

A method of manufacturing a thin-film transistor array substrate according to a fourth exemplary embodiment of the present invention comprises: (FIG. 7A) forming a gate electrode and a scanning line on a transparent insulating substrate; (FIG. 7B) forming an insulating layer on the transparent insulating substrate that includes the gate electrode and the scanning line; and (FIG. 7C) forming a transparent semiconductor layer on the insulating layer in an area which will become a channel of the gate electrode, and simultaneously forming on the insulating layer an etching-stop layer consisting of a material identical with that of the transparent semiconductor layer. The method further comprises: (FIG. 8A) forming at least a drain electrode, a source electrode and a signal line on the insulating layer; (FIG. 8B) forming a passivation layer on the insulating layer that includes the transparent semiconductor layer, the etching-stop layer, the signal line, the drain electrode and the source electrode; (FIG. 8B) forming a depression, which hollows the passivation layer to the surface of the etching-stop layer, in the passivation layer, and simultaneously forming a contact hole that communicates with the source electrode; and (FIG. 8C) forming a pixel electrode on the passivation layer that includes areas of the depression and the contact hole.

(Mode 4)

A method of manufacturing a thin-film transistor array substrate according to a fifth embodiment of the present invention comprises: (FIG. 14A) forming a gate electrode and a scanning line on a transparent insulating substrate; (FIG. 14B) forming an insulating layer on the transparent semiconductor layer that includes the gate electrode and the scanning line; and (FIG. 14C) forming a transparent semiconductor layer on the insulating layer in an area which will become a channel of the gate electrode, and simultaneously forming on the insulating layer a pixel protrusion consisting of a material identical with that of the transparent semiconductor layer. The method further comprises: (FIG. 15A) forming at least a drain electrode, a source electrode and a signal line on the insulating layer; (FIG. 15B) forming a passivation layer on the insulating layer that includes the transparent semiconductor layer, the pixel protrusion, the signal line, the drain electrode and the source electrode; (FIG. 15B) forming a contact hole, which communicates with the source electrode, in the passivation layer; and (FIG. 15C) forming a pixel electrode on the passivation layer that includes areas of the pixel protrusion and the contact hole.

(Mode 5)

First Exemplary Embodiment

A thin-film transistor array substrate according to a first exemplary embodiment of the present invention will now be described with reference to the drawings, in which FIG. 1 is a partial plan view schematically illustrating the structure of the pixel portion of a thin-film transistor array substrate according to a first exemplary embodiment of the present invention; FIG. 2 is a sectional view taken along line A-A' of FIG. 1 schematically illustrating the structure of the pixel portion of a thin-film transistor array substrate according to a first exemplary embodiment of the present invention; FIG. 3 is a sectional view taken along line B-B' of FIG. 1 schematically illustrating the structure of the pixel portion of a thin-film transistor array substrate according to a first exemplary embodiment of the present invention; FIG. 4 is a sectional view taken along line C-C' of FIG. 1 schematically illustrating the structure of the pixel portion of a thin-film transistor array substrate according to a first exemplary embodiment of the present invention; FIG. 5 is a sectional view corresponding to line A-A' of FIG. 1 schematically illustrating the structure of the pixel portion of a liquid crystal display device using a thin-film transistor array substrate according to a first exemplary embodiment of the present invention; and FIG. 6 is a partial plan view schematically illustrating a modification of the structure of the pixel portion of a thin-film transistor array substrate according to a first exemplary embodiment of the present invention. It should be noted that a transparent insulating substrate 1, insulating layer 4 and passivation layer 10 are omitted from FIGS. 1 and 6.

With reference to FIGS. 1 to 4, a thin-film transistor array substrate 13 is a substrate in which a plurality of thin-film transistors have been formed in the form of matrix. This is a substrate placed in a liquid crystal display device 25 (FIG. 5) on the side opposite a color filter substrate 16 (FIG. 5) of a liquid crystal layer 18 (FIG. 5). The thin-film transistor array substrate 13 is used in a liquid crystal display device employed in a liquid crystal television, mechanical control unit or mobile telephone, etc. Formed on the thin-film transistor array substrate 13 are a scanning line 3 and a signal line 9 intersecting the scanning line 3 three-dimensionally. A plurality of scanning lines 3 and a plurality of signal lines 9 are formed. Rectangular areas delimited by these scanning and signal lines are respective pixel portions.

In a pixel portion of the thin-film transistor array substrate 13, a gate electrode 2 connected to a scanning line 3 is formed on a transparent insulating substrate 1 in the region of the thin-film transistor, an insulating layer 4 which will become a gate insulating film is formed on the gate electrode 2, a transparent semiconductor layer 5 which will become a channel is formed on the insulating layer 4, a drain electrode 7, which is connected to the signal line 9, and a source electrode 8 are formed on respective sides of the transparent semiconductor layer 5, and a passivation layer 10 is formed on the insulating layer 4 that includes the transparent semiconductor layer 5, the drain electrode 7 and the source electrode 8. A portion of the source electrode 8, which extends into the region of a pixel electrode 12, is formed on an etching-stop layer 6 and is electrically connected to the pixel electrode 12 through a contact hole 20 formed in the passivation layer 10.

In a pixel portion of the thin-film transistor array substrate 13, the insulating layer 4 is formed on the transparent insulating substrate 1 in the region of the pixel electrode 12 (the region exclusive of the thin-film transistor), the etching-stop layer 6 is formed on the insulating layer 4, the passivation layer 10 is formed on the etching-stop layer 6, the pixel electrode 12 is formed on the passivation layer 10, the pixel electrode 12 is connected to the etching-stop layer 6 through a depression 11 formed in the passivation layer 10, and the pixel electrode 12 is electrically connected to the source electrode 8 through the contact hole 20 formed in the passivation layer 10.

The transparent insulating substrate 1 is a transparent plate-shaped insulating substrate comprising glass or the like.

The gate electrode 2 and scanning line 3 are made of the same material, comprise a conductor (e.g., a metal such as chrome, molybdenum or aluminum alloy) and are formed in the same layer on the transparent insulating substrate 1. The gate electrode 2 is shaped to branch from the scanning line 3, and one gate electrode 2 is disposed in every pixel portion. The scanning line 3 is electrically connected to a gate driver IC (not shown).

A transparent insulator such as silicon nitride or silicon oxide can be used as the insulating layer 4.

The transparent semiconductor layer 5 and etching-stop layer 6 are made of the same material, comprise a transparent semiconductor (e.g., zinc oxide, gallium indium zinc oxide, zinc sulfide, etc.) and are formed in the same layer. The transparent semiconductor layer 5 will become the channel of a thin-film transistor. The transparent semiconductor layer 5 is formed on the insulating layer 4 in the region of the thin-film transistor in the pixel portion so as to bestride the gate electrode 2. The drain electrode 7 and source electrode 8 are formed so as to ride up onto both edges of the transparent semiconductor layer 5. The etching-stop layer 6 is separated from the transparent semiconductor layer 5 and is formed in the region of the pixel electrode 12 in the pixel portion (the region exclusive of the region of the thin-film transistor). A portion of the source electrode 8 is formed so as to ride up onto the etching-stop layer 6 so that the etching-stop layer 6 is electrically connected to the source electrode 8. The etching-stop layer 6 is connected to the pixel electrode 12 through the depression 11 formed in the passivation layer 10. The etching-stop layer 6 is placed so as not to overlap the scanning line 3 and signal line 9. Preferably, the etching-stop layer 6 is formed so that the planar shape thereof will be approximately the same as the shape of the portion inside the region of the pixel portion in the pixel electrode 12, as shown in FIG. 1, in order to suppress disclination due to a difference in level at the edges of the etching-stop layer 6.

The drain electrode 7, source electrode 8 and signal line 9 are made of the same material, comprise a conductor (a metal such as chrome, molybdenum, aluminum alloy or a lower layer of a transition metal, an intermediate layer of an aluminum alloy and an upper layer of a transition metal) and are formed in the same layer. The drain electrode 7 has a shape branching from the signal line 9, one is disposed for every pixel portion and is formed in such a manner that a portion thereof rises up onto the transparent semiconductor layer 5. The source electrode 8 is formed between the transparent semiconductor layer 5 and the etching-stop layer 6 in such a manner that portions thereof ride up onto the transparent semiconductor layer 5 and etching-stop layer 6. The signal line 9 is electrically connected to a signal-line driver IC (not shown).

By way of example, a transparent insulator such as silicon nitride or silicon oxide can be used as the passivation layer 10. The passivation layer 10 is formed to have the depression 11, which hollows the passivation layer to the surface of the etching-stop layer 6, in the vicinity of the center of each pixel portion. The depression 11 is for forming a depression in the surface of the pixel electrode 12 and controlling the direction in which the liquid crystal molecules tilt. This is for the purpose of connecting the pixel electrode 12 and the etching-stop layer 6. Although the planar shape of the depression 11 is rectangular in FIG. 1, it can be made X-shaped, as shown by depression 11' in FIG. 6, or the shape of a star or polygon having a plurality of projections extending radially outward from the center. The passivation layer 10 is formed to have the contact hole 20, which communicates with the source electrode 8, in the region where the source electrode 8 and pixel electrode 12 overlap. The contact hole 20 is electrically connects the source electrode 8 to the pixel electrode 12. The side-wall surfaces of the depression 11 and contact hole 20 are tapered inward so that the depression and contact hole are narrower on the base side.

The pixel electrode 12 comprises a transparent conductor [indium tin oxide (ITO), etc.]. The pixel electrode 12 is formed on the passivation layer 10 in a region exclusive of the thin-film transistor. Although a portion of the pixel electrode 12 is formed so as to overlap the scanning line 3 in FIG. 1, it may be formed so as not to overlap the scanning line 3, as illustrated in FIG. 6. The pixel electrode 12 is connected to the etching-stop layer 6 through the depression 11 formed in the passivation layer 10 and is electrically connected to the source electrode 8 through the contact hole 20 formed in the passivation layer 10. The surface of the pixel electrode 12 is recessed in conformity with the shapes of the depression 11 and contact hole 20. The direction in which the liquid crystal molecules tilt is controlled by the recesses formed in the surface of the pixel electrode 12.

The thin-film transistor array substrate 13 shown in FIGS. 1 to 4 is used in a liquid crystal display device 25 in the manner shown in FIG. 5. The thin-film transistor array substrate 13 has an array-side polarizer 30 affixed to the surface of the transparent insulating substrate 1. A backlight unit (not shown) is provided on the surface side of the array-side polarizer 30.

The thin-film transistor array substrate 13 has a liquid crystal alignment layer 14 (e.g., polyimide) formed on the passivation layer 10 that includes the pixel electrode 12. A liquid crystal layer 18 is placed on the liquid crystal alignment layer 14. The color filter substrate 16 is disposed on the side of the liquid crystal layer 18 that is opposite the thin-film transistor array substrate 13. The thin-film transistor array substrate 13 is affixed by a sealing member (not shown, an example being an adhesive agent) to the color filter substrate 16 and is spaced a prescribed distance away from the color filter substrate 16.

The color filter substrate 16 has a light-shielding layer 34, which will serve as a black matrix, formed on a glass substrate 32 (on the surface on the side of the liquid crystal layer 18). A color layer 33, which will serve as a color filter, is formed in the empty space in the same layer as that of the light-shielding layer 34. A protective layer 35 is formed on the surface of the light-shielding layer 34 and color layer 33 that is on the side of the liquid crystal layer 18. An opposing common electrode 15 is formed on the surface of the protective layer 35 that is on the side of the liquid crystal layer 18. The light-shielding layer 34 comprises a light-shielding material such as chrome and is provided in portions corresponding to the areas between the plurality of pixel portions, the areas in which the thin-film transistors are formed and in the areas where storage capacitors (not shown) are formed. The color layer 33 is composed of a red filter layer, a green filter layer and a blue filter layer and is disposed so as to correspond to the pixel portions of each color. The protective layer 35 is a layer comprising a transparent insulator. The opposing common electrode 15 comprises a transparent conductor (ITO, etc.) and is formed so as to be shared by all of the pixel portions. The color filter substrate 16 has a liquid crystal alignment layer 17 (e.g., polyimide) formed on the opposing common electrode 15. The color filter substrate 16 has a color-filter-side polarizer 31 affixed to the surface of the glass substrate 32.

The liquid crystal layer 18 is a layer comprising liquid crystal molecules of the vertical alignment mode. The liquid crystal layer 18 is sealed between the thin-film transistor array substrate 13 and the color filter substrate 16.

The liquid crystal display device 25 operates in the manner described below.

With no voltage is applied across the pixel electrode 12 and opposing common electrode 15, the vertically aligned liquid crystal molecules in the liquid crystal layer 18 are aligned perpendicular to the liquid crystal alignment layers 14 and 17. Accordingly, the liquid crystal molecules are aligned in directions that differ from one another inside the domain-regulating depression 11 of the thin-film transistor array substrate 13.

When a voltage is applied across the pixel electrode 12 and opposing common electrode 15, on the other hand, the vertically aligned liquid crystal molecules in the liquid crystal layer 18 align in a direction perpendicular to the electric field. As a result, the directions of alignment of the liquid crystal molecules differ from one another radially outward from the depression 11. Hence the liquid crystal exhibits a viewing-angle characteristic wider than in the case of the TN (Twisted Nematic) mode.

Next, a method of manufacturing the thin-film transistor array substrate according to the first exemplary embodiment of the present invention will be described with reference to the drawings, in which FIGS. 7A to 7C and FIGS. 8A to 8C are process sectional views schematically illustrating a method of manufacturing a thin-film transistor array substrate according to the first exemplary embodiment.

First, an electrically conductive film (not shown) for the gate electrode 2 and scanning line 3 is formed on the transparent insulating substrate 1. This is followed by forming a photoresist (not shown) on the portions of this conductive film that will remain as the gate electrode 2 and scanning line 3, and then by etching away the film using the photoresist as a mask, thereby forming the gate electrode 2 and scanning line 3. The photoresist is then removed (step A1; see FIG. 7A). The electrically conductive film can be obtained by forming a film of a metal such as chrome, molybdenum or aluminum alloy using a sputtering method, by way of example. The film thickness of the conductive film can be made on the order of 100 to 300 nm.

Next, a film of the insulating layer 4 is formed on the transparent insulating substrate 1 that includes the gate electrode 2 and scanning line 3 (step A2; see FIG. 7B). By way of example, the insulating layer 4 can be obtained by forming a film of silicon nitride or silicon oxide using a sputtering method of plasma CVD method. The film thickness of the insulating layer 4 can be made on the order of 300 to 500 nm.

Following the formation of the insulating layer 4, a transparent conductive film (not shown) for the transparent semiconductor layer 5 and etching-stop layer 6 is formed on the insulating layer 4, then a photoresist (not shown) is formed on the portions of this transparent conductive film that will remain as the transparent semiconductor layer 5 and etching-stop layer 6, then the film is etched away using the photoresist as a mask, thereby forming the transparent semiconductor layer 5 and etching-stop layer 6 simultaneously. The photoresist is then removed (step A3; see FIG. 7C). The transparent conductive film can be obtained by forming a film of a transparent conductor such as zinc oxide, gallium indium zinc oxide or zinc sulfide using a CVD method, vacuum deposition method or sol-gel process. The film thickness of the transparent conductive film can be made on the order of 20 to 200 nm. Further, the insulating layer 4 and transparent conductive film may be formed successively in the same apparatus while the vacuum is maintained.

Next, a conductive film (not shown) for the drain electrode 7, source electrode 8 and signal line 9 is formed on the insulating layer 4 that includes the transparent semiconductor layer 5 and etching-stop layer 6, then a photoresist (not shown) is formed on the portions of this conductive film that will remain as the drain electrode 7, source electrode 8 and signal line 9, then the film is etched away using the photoresist as a mask, thereby forming the drain electrode 7, source electrode 8 and signal line 9. The photoresist is then removed (step A4; see FIG. 8A). The conductive film can be obtained by forming a film of a metal such as chrome, molybdenum, aluminum alloy or a lower layer of a transition metal, an intermediate layer of an aluminum alloy and an upper layer of a transition metal. The reason for adopting a conductive film having the three layers, namely the lower layer of a transition metal, the intermediate layer of an aluminum alloy and the upper layer of a transition metal, is to lower the contact resistance between the drain electrode 7 and source electrode 8 and the transparent semiconductor layer 5 and the contact resistance between the source electrode 8 and pixel electrode 12. The film thickness of the conductive film can be made on the order of 100 to 300 nm.

Next, the passivation layer 10 is formed on the insulating layer 4 that includes the transparent semiconductor layer 5, etching-stop layer 6, drain electrode 7, source electrode 8 and signal line 9, then a photoresist (not shown) is formed on the passivation layer 10 except in those areas that will form the depression 11 and contact hole 20, then the passivation layer 10 is etched away using the photoresist as a mask, thereby forming the depression 11 and contact hole 20. The photoresist is then removed (step A5; see FIG. 8B). The passivation layer 10 can be obtained by forming a film of silicon nitride or silicon dioxide by a sputtering method of plasma CVD method, by way of example. Further, although the depression 11 and contact hole 20 are formed by etching the passivation layer 10 by dry etching with a gas that includes a fluorine radical, almost no etching of the etching-stop layer 6 and source electrode 8 occurs due to such dry etching. The etching of the passivation layer 10, therefore, stops at the etching-stop layer 6 and source electrode 8.

Although it is not illustrated, contact holes of terminal portions for the scanning lines 3 and for the signal lines 9 disposed at the periphery of the display section also are formed simultaneously at step A5. Further, contact holes of terminal portions for the scanning lines 3 are formed by etching also the insulating layer 4 and not just the passivation layer 10.

Next, a film of a transparent conductor for the pixel electrode 12 is formed on the passivation layer 10 that includes the depression 11 and contact hole 20, then a photoresist (not shown) is formed on the portions of this transparent conductive film that will remain as the pixel electrode 12, then the film is etched away using the photoresist as a mask, thereby forming the pixel electrode 12. The photoresist is then removed (step A6; see FIG. 8C). As a result, the pixel electrode 12 is electrically connected to the source electrode 8 through the contact hole 20 and the surface thereof becomes recessed owing to the depression 11. By way of example, the transparent conductive film can be obtained by forming a film of indium tin oxide (ITO) using a sputtering method. It should be noted that the resistance of the transparent conductive film may be adjusted as necessary by a method such as introducing an impurity by doping, etc. Further, the film thickness of the transparent conductive film can be made on the order of 20 to 200 nm. Preferably, the pixel electrode 12 is formed so that the planar shape thereof will be approximately the same as the shape of the etching-stop layer 6 in order to suppress disclination due to a difference in level at the edges of the etching-stop layer 6. This may be followed by annealing at a temperature on the order of 100 to 200° C.

At step A6, terminal portions of the scanning lines 3 and signal lines 9 disposed at the periphery of the display section are electrically connected to the transparent conductive film through contact holes and a formed into prescribed wiring patterns.

This completes the manufacture of the thin-film transistor array substrate 13 similar to the one shown in FIGS. 1 to 4. A method of manufacturing the liquid crystal display device 25 (FIG. 5) which uses the thin-film transistor array substrate 13 will now be described.

First, the liquid crystal alignment layer 14 is formed on the display section of the surface of the thin-film transistor array substrate 13 on the side having the pixel electrode 12. Further, the liquid crystal alignment layer 17 is formed on the display section of the surface of the color filter substrate 16 on the side having the opposing common electrode 15.

Next, the thin-film transistor array substrate 13 and color filter substrate 16 are placed in such a manner that the pixel electrode 12 and opposing common electrode 15 oppose each other, and liquid crystal is sealed between the substrates 13 and 16 by a slender sealing member (adhesive agent) in the vicinity of the display section, thereby forming the liquid crystal layer 18.

Next, the array-side polarizer 30 is affixed to the surface of the transparent insulating substrate 1 of thin-film transistor array substrate 13, and the color-filter-side polarizer 31 is affixed to the surface of the glass substrate 32 of color filter substrate 16. This completes the liquid crystal display device 25 similar to the one shown in FIG. 5.

This is followed by connecting a gate-driver IC and signal-line driver IC, etc., to the respective terminals (not shown) of the liquid crystal display device 25 and providing a backlight unit (not shown) on the side of the thin-film transistor array substrate 13.

In accordance with the first exemplary embodiment, the etching-stop layer 6 in the pixel region is transparent and hence it is possible to enlarge the aperture ratio (the area ratio of the portion that transmits light in a case where a pixel is divided into a portion that transmits light and a portion that does not). As a result, a liquid crystal display device exhibiting an excellent display characteristic is obtained. In other words, a high-performance display brighter than heretofore can be realized. Alternatively, if the brightness of the device is made the same as that heretofore, a display that consumes less power than heretofore can be achieved.

Further, in accordance with the first exemplary embodiment, a difference in level other than that of the depression 11, which affects the aligning of the vertically aligned liquid crystal molecules in the liquid crystal layer 18, does not exist within the pixel region. As a result, alignment of the liquid crystal molecules is free of disturbance (disclination) and the display characteristic can be improved. In other words, since the etching-stop layer 6 is transparent, the transmission of light is not impeded even if the area of the etching-stop layer 6 is increased to a desired extent. Consequently, a large aperture ratio can be assured even if the etching-stop layer 6 is made substantially the same size as that of the pixel electrode 12 within the pixel region, and it is possible to eliminate a difference in level, which is ascribable to the etching-stop layer 6, from within the pixel region of the pixel electrode 12. As a result, disclination due to a difference in level other than that of the depression 11 is eliminated and the display characteristic can be improved.

Further, in accordance with the first exemplary embodiment, the etching-stop layer 6 can be formed at the same time as the transparent semiconductor layer 5 of the thin-film transistor. This means that there is no increase in steps for forming a photoresist. As a result, the above-described effects can be realized without an increase in device manufacturing cost.

Second Exemplary Embodiment

A thin-film transistor array substrate according to a second exemplary embodiment of the present invention will now be described with reference to the drawings, in which FIG. 9 is a partial plan view schematically illustrating the structure of the pixel portion of a thin-film transistor array substrate according to a second exemplary embodiment of the present invention; FIG. 10 is a sectional view taken along line A-A' of FIG. 9 schematically illustrating the structure of the pixel portion of a thin-film transistor array substrate according to a second exemplary embodiment of the present invention; FIG. 11 is a sectional view taken along line B-B' of FIG. 9 schematically illustrating the structure of the pixel portion of a thin-film transistor array substrate according to a second exemplary embodiment of the present invention; FIG. 12 is a sectional view taken along line C-C' of FIG. 9 schematically illustrating the structure of the pixel portion of a thin-film transistor array substrate according to a second exemplary embodiment of the present invention; and FIG. 13 is a sectional view corresponding to line A-A' of FIG. 1 schematically illustrating the structure of the pixel portion of a liquid crystal display device using a thin-film transistor array substrate according to a second exemplary embodiment of the present invention. It should be noted that a transparent insulating substrate 1, insulating layer 4 and passivation layer 10 are omitted from FIG. 9.

In the first exemplary embodiment, the depression 11 (FIG. 2) the bottom surface of which is the etching-stop layer 6 (transparent semiconductor) (FIG. 2) is formed in the passivation layer 10 (FIG. 2), thereby making the surface shape of the pixel electrode 12 (FIG. 2) recessed in conformity with the depression 11 (FIG. 2) and controlling the direction of tilt of the liquid crystal molecules. In the second exemplary embodiment, however, a protrusion 19 (a transparent conductor) is formed below the passivation layer 10, thereby causing the passivation layer 10 to have a protruding shape and, in turn, causing the surface shape of a pixel electrode 21 to protrude, thus controlling the direction of tilt of the liquid crystal molecules. Other structural elements of this exemplary embodiment are similar to those of the first exemplary embodiment.

In the second exemplary embodiment, the protrusion 19 (transparent conductor) is not for causing the etching of the transparent insulating substrate 1 to stop, and a depression (with the exception of the contact hole) of the kind in the first exemplary embodiment is not formed in the passivation layer 10. The protrusion 19 consists of the same material as that of the transparent semiconductor layer 5, comprises a transparent semiconductor (e.g., zinc oxide, gallium indium zinc oxide, zinc sulfide, etc.) and is formed in the same layer as that of the transparent semiconductor layer 5. The protrusion 19 is separated from the transparent semiconductor layer 5 and is placed in the vicinity of the center of the pixel region. The size of the protrusion 19 is not similar to that of the pixel electrode 21. Although the passivation layer 10 is formed on the protrusion 19, the protrusion 19 does not touch the source electrode 8. The protrusion 19 is not connected to the pixel electrode 21 on the passivation layer 10. The planar shape of the protrusion 19 is the X-shape shown in FIG. 9. However, in consideration of the direction of tilt of the liquid crystal molecules, the protrusion 19 can be made the shape of a star, polygon or circle having a plurality of projections extending radially outward from the center.

With no voltage is applied across the pixel electrode 21 and opposing common electrode 15, the vertically aligned liquid crystal molecules in the liquid crystal layer 18 are aligned perpendicular to the liquid crystal alignment layers 14 and 17. Accordingly, the liquid crystal molecules are aligned in directions that differ from one another at the periphery of the portion of the pixel electrode 21 that projects in conformity with the domain-regulating protrusion 19 of a thin-film transistor array substrate 22.

When a voltage is applied across the pixel electrode 21 and opposing common electrode 15, on the other hand, the vertically aligned liquid crystal molecules in the liquid crystal layer 18 align in a direction perpendicular to the electric field. As a result, the directions of alignment of the liquid crystal molecules differ from one another radially outward from portion of the pixel electrode 21 that projects in conformity with the protrusion 19. Hence the liquid crystal exhibits a viewing-angle characteristic wider than in the case of the TN (Twisted Nematic) mode.

Next, a method of manufacturing the thin-film transistor array substrate according to the second exemplary embodiment of the present invention will be described with reference to the drawings, in which FIGS. 14A to 14C and FIGS. 15A to 15C are process sectional views schematically illustrating a method of manufacturing a thin-film transistor array substrate according to the second exemplary embodiment.

First, an electrically conductive film (not shown) for the gate electrode 2 and scanning line 3 is formed on the transparent insulating substrate 1. This is followed by forming a photoresist (not shown) on the portions of this conductive film that will remain as the gate electrode 2 and scanning line 3, and then by etching away the film using the photoresist as a mask, thereby forming the gate electrode 2 and scanning line 3. The photoresist is then removed (step B1; see FIG. 14A). This step is similar to step A1 (see FIG. 7A) according to the first exemplary embodiment.

Next, a film of the insulating layer 4 is formed on the transparent insulating substrate 1 that includes the gate electrode 2 and scanning line 3 (step B2; see FIG. 14B). This step is similar to step A2 (see FIG. 7B) according to the first exemplary embodiment.

Following the formation of the insulating layer 4, a transparent conductive film (not shown) for the transparent semiconductor layer 5 and protrusion 19 is formed on the insulating layer 4, then a photoresist (not shown) is formed on the portions of this transparent conductive film that will remain as the transparent semiconductor layer 5 and protrusion 19, then the film is etched away using the photoresist as a mask, thereby forming the transparent semiconductor layer 5 and protrusion 19 simultaneously. The photoresist is then removed (step B3; see FIG. 14C). Here the protrusion 19 can be given an X-shaped configuration. In other respects this step is similar to step A3 (see FIG. 7C) according to the first exemplary embodiment.

Next, a conductive film (not shown) for the drain electrode 7, source electrode 8 and signal line 9 is formed on the insulating layer 4 that includes the transparent semiconductor layer 5 and protrusion 19, then a photoresist (not shown) is formed on the portions of this conductive film that will remain as the drain electrode 7, source electrode 8 and signal line 9, then the film is etched away using the photoresist as a mask, thereby forming the drain electrode 7, source electrode 8 and signal line 9. The photoresist is then removed (step B4; see FIG. 15A). This step is similar to step A4 (see FIG. 8A) according to the first exemplary embodiment.

Next, the passivation layer 10 is formed on the insulating layer 4 that includes the transparent semiconductor layer 5, protrusion 19, drain electrode 7, source electrode 8 and signal line 9, then a photoresist (not shown) is formed on the passivation layer 10 except in the area that will form the contact hole 20, then the passivation layer 10 is etched away using the photoresist as a mask, thereby forming the contact hole 20. The photoresist is then removed (step B5; see FIG. 15B). This step differs from step A5 (see FIG. 8B) of the first exemplary embodiment in that the depression (see FIG. 8B) is not formed. In other respects this step is similar to step A5 (see FIG. 8B) according to the first exemplary embodiment.

Next, a film of a transparent conductor for the pixel electrode 21 is formed on the passivation layer 10 that includes the contact hole 20, then a photoresist (not shown) is formed on the portions of this transparent conductive film that will remain as the pixel electrode 21, then the film is etched away using the photoresist as a mask, thereby forming the pixel electrode 21. The photoresist is then removed (step B6; see FIG. 15C). As a result, the pixel electrode 21 is electrically connected to the source electrode 8 through the contact hole 20 and the surface thereof projects owing to the protrusion 19. Further, the pixel electrode 21 is formed in an area larger than the protrusion 19 since use is made of the difference in level at the edges of the protrusion 19. In other respects this step is similar to step A6 (see FIG. 8C) according to the first exemplary embodiment.

This completes the manufacture of the thin-film transistor array substrate 22 similar to the one shown in FIGS. 9 to 12. A method of manufacturing a liquid crystal display device 26 (FIG. 13) which uses the thin-film transistor array substrate 22 is similar to the method of the first exemplary embodiment.

In accordance with the second exemplary embodiment, the protrusion 19 in the pixel region is transparent and hence it is possible to enlarge the aperture ratio (the area ratio of the portion that transmits light in a case where a pixel is divided into a portion that transmits light and a portion that does not). As a result, a liquid crystal display device exhibiting an excellent display characteristic is obtained. In other words, a high-performance display brighter than heretofore can be realized. Alternatively, if the brightness of the device is made the same as that heretofore, a display that consumes less power than heretofore can be achieved.

Further, in accordance with the second exemplary embodiment, a difference in level other than that of the protrusion 19, which affects the aligning of the vertically aligned liquid crystal molecules in the liquid crystal layer 18, does not exist within the pixel region. As a result, alignment of the liquid crystal molecules is free of disturbance (disclination) and the display characteristic can be improved.

Further, in accordance with the second exemplary embodiment, the protrusion 19 can be formed at the same time as the transparent semiconductor layer 5 of the thin-film transistor. This means that there is no increase in steps for forming a photoresist. As a result, the above-described effects can be realized without an increase in device manufacturing cost.

Third Exemplary Embodiment

A thin-film transistor array substrate according to a third exemplary embodiment of the present invention will now be described with reference to the drawings, in which FIG. 16 is a partial plan view schematically illustrating the structure of the pixel portion of a thin-film transistor array substrate according to a third exemplary embodiment of the present invention. It should be noted that a glass substrate (which corresponds to the transparent insulating substrate 1 of FIG. 2), an insulating layer (which corresponds to the insulating layer 4 of FIG. 2) and a passivation layer (which corresponds to the passivation layer 10 of FIG. 2) are not shown in FIG. 16.

In the first exemplary embodiment, a single pixel region has a single pixel electrode 12 (FIG. 1). In the third exemplary embodiment, however, the pixel electrode 12 in a single pixel region comprises a plurality (three in FIG. 16) of subpixel electrodes 12a, 12b, 12c, and the subpixel electrodes 12a, 12b, 12c are joined by connecting portions 12d. Further, every one of the regions of the subpixel electrodes 12a, 12b, 12c is provided with the depression 11 for realizing divided alignment. The etching-stop layer 6 is slightly larger than the region of the pixel electrode 12. This exemplary embodiment is similar to the first exemplary embodiment in terms of other structural elements and method of manufacture.

In accordance with the third exemplary embodiment, effects similar to those of the first exemplary embodiment are obtained. In addition, since the shape of each of the subpixel electrodes 12a, 12b, 12c has approximate point symmetry about the depression 11 as center, a plurality of divided domains can be produced in stable fashion. Further, if the vertical-to-horizontal ratio of one pixel region is not 1:1, as in the third exemplary embodiment, an excellent display is obtained in a case where a plurality of color display pixels for presenting a color display utilizing color filters are provided. That is, in a case where a set of three color display pixels of the colors red, blue and green is adopted as a single display unit, an arrangement in which the vertical-to-horizontal ratio is 3:1, as shown in FIG. 16, can be utilized in ideal fashion.

Fourth Exemplary Embodiment

A thin-film transistor array substrate according to a fourth exemplary embodiment of the present invention will now be described with reference to the drawings, in which FIG. 17 is a partial plan view schematically illustrating the structure of the pixel portion of a thin-film transistor array substrate according to a fourth exemplary embodiment of the present invention. It should be noted that a glass substrate (which corresponds to the transparent insulating substrate 1 of FIG. 2), an insulating layer (which corresponds to the insulating layer 4 of FIG. 2) and a passivation layer (which corresponds to the passivation layer 10 of FIG. 2) are not shown in FIG. 17.

The thin-film transistor array substrate according to the fourth exemplary embodiment is substantially similar to that of the third exemplary embodiment but the shape of the pixel electrode 12 is different. Specifically, in order to stabilize the alignment of the liquid crystal, the circumferential portion of each of the pixel electrodes 12a, 12b, 12c is provided with a plurality of slits 12e. This exemplary embodiment is similar to the third exemplary embodiment in terms of other structural elements and method of manufacture.

In accordance with the fourth exemplary embodiment, effects similar to those of the third exemplary embodiment are obtained. In addition, it is possible to stabilize the alignment of the liquid crystal even more than in the third exemplary embodiment by providing the circumferential portion of each of the pixel electrodes 12a, 12b, 12c with the slits 12e.

Fifth Exemplary Embodiment

Figure 22:
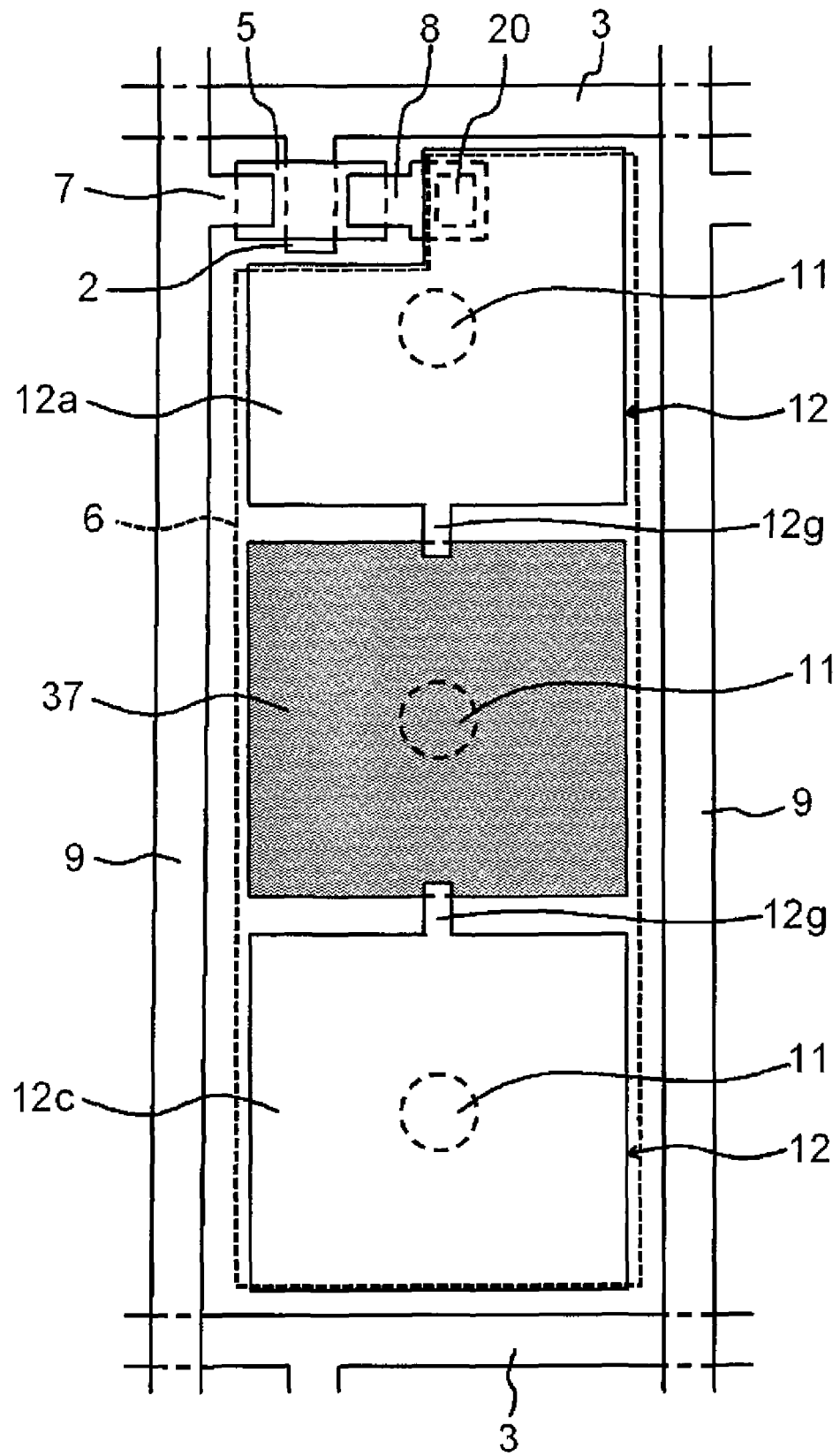
FIG. 22 is a partial plan view schematically illustrating the structure of the pixel portion of a thin-film transistor array substrate according to an example 5-2 of the present invention.
Figure 23:
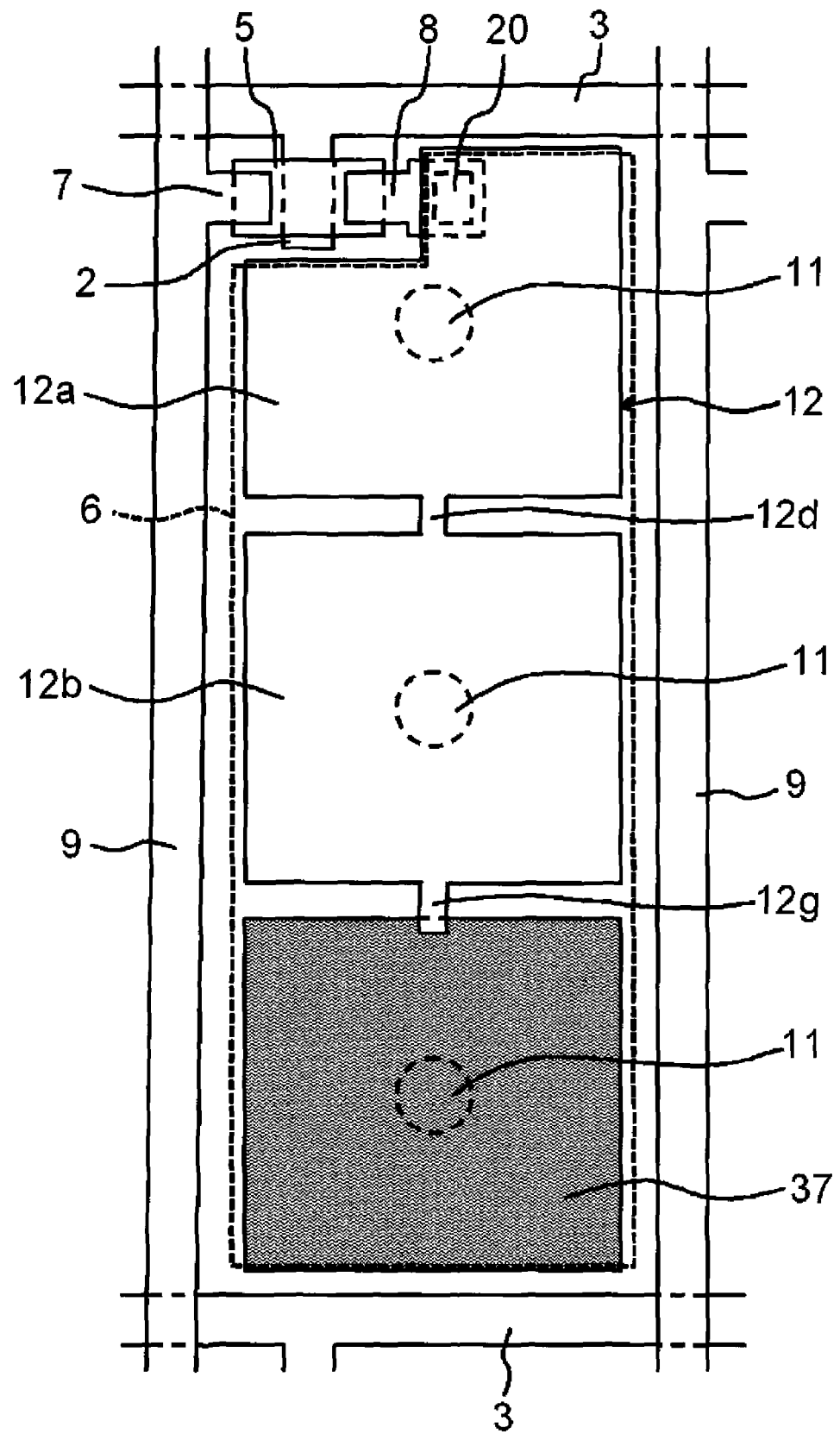
FIG. 23 is a partial plan view schematically illustrating the structure of the pixel portion of a thin-film transistor array substrate according to an example 5-3 of the present invention.
Figure 24:
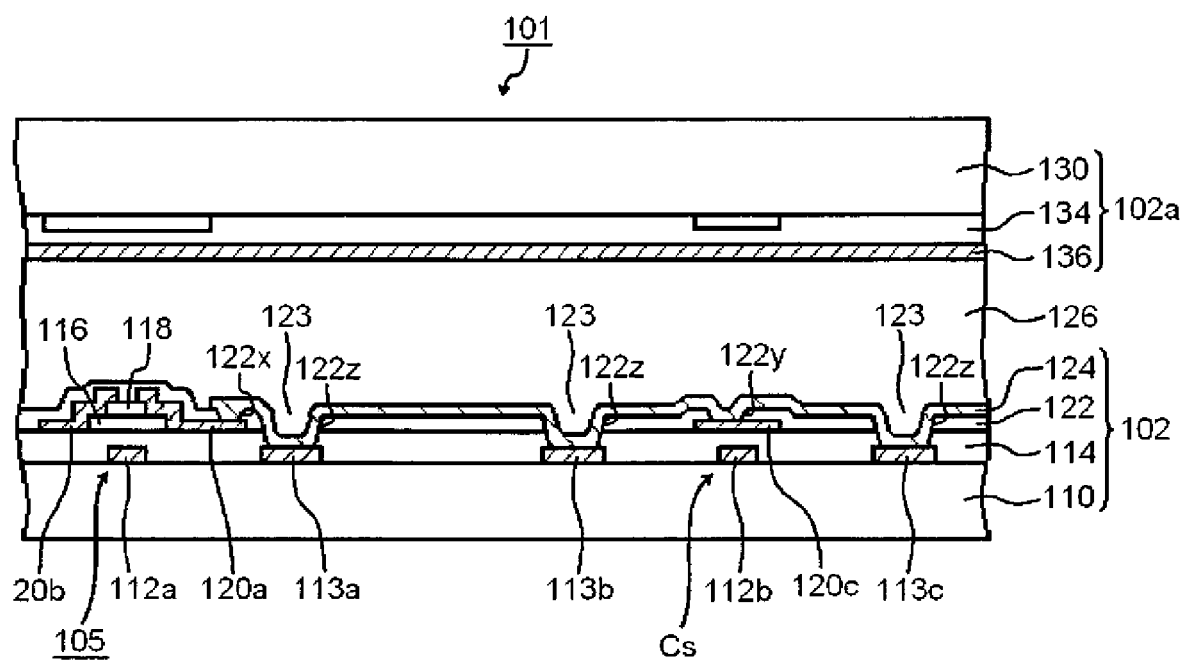
FIG. 24 is a sectional view schematically illustrating the structure of a liquid crystal display device according to the conventional art.

A thin-film transistor array substrate according to a fifth exemplary embodiment of the present invention will now be described with reference to the drawings, in which FIG. 18 is a partial plan view schematically illustrating the structure of the pixel portion of a thin-film transistor array substrate according to a fifth exemplary embodiment of the present invention; FIG. 19 is a sectional view taken along line D-D' of FIG. 18 schematically illustrating the structure of the pixel portion of a thin-film transistor array substrate according to a fifth exemplary embodiment of the present invention; FIG. 20 is a partial plan view schematically illustrating the structure of the pixel portion of a thin-film transistor array substrate according to an example 5-1 of the present invention; FIG. 21 is a sectional view taken along line E-E' of FIG. 20 schematically illustrating the structure of the pixel portion of a thin-film transistor array substrate according to an example 5-1 of the present invention; FIG. 22 is a partial plan view schematically illustrating the structure of the pixel portion of a thin-film transistor array substrate according to an example 5-2 of the present invention; FIG. 23 is a partial plan view schematically illustrating the structure of the pixel portion of a thin-film transistor array substrate according to an example 5-3 of the present invention. It should be noted that the transparent insulating substrate 1, insulating layer 4 and passivation layer 10 are not shown in FIGS. 18, 20, 22 and 23. A second passivation layer 38 also is not shown in FIG. 18.

In the third exemplary embodiment, only the transmissive pixel electrode 12 (FIG. 16) is used as the pixel electrode. In the fifth exemplary embodiment, however, a reflective pixel electrode 37 and the transmissive pixel electrode 12 are used (see FIGS. 18 and 19). The reflective electrode 37 (or reflective pattern) is formed in the same layer as that of the pixel electrode 12 (FIG. 16) of the third exemplary embodiment, is electrically connected to the source electrode 8 through the contact hole 20 in the passivation layer 10 and is recessed in conformity with the depression 11 in the passivation layer 10. The second passivation layer 38 is formed on the passivation layer 10 that includes the reflective electrode 37. The second passivation layer 38 is recessed in conformity with the depression 11 in the passivation layer 10. A contact hole 36 communicating with the reflective electrode 37 is formed on the second passivation layer 38. The pixel electrode 12, which comprises the subpixel electrodes 12b, 12c connected by the connecting portions 12d, is formed on the second passivation layer 38. The subpixel electrode 12b has a connecting portion 12f for connecting it to the reflective electrode 37. The connecting portion 12f is electrically connected to the reflective electrode 37 through the contact hole 36. The pixel electrode 12 is recessed in conformity with the recessed portion of the second passivation layer 38 corresponding to the depression 11 in the passivation layer 10. Other structural elements of this exemplary embodiment are similar to those of the third exemplary embodiment.

A method of manufacturing the thin-film transistor array substrate according to the fifth exemplary embodiment includes forming the depression 11 and contact hole 20 in the passivation layer 10 by the process of steps A1 to A5 of the first exemplary embodiment, thereafter forming the reflective electrode 37 on the passivation layer 10 that includes the depression 11 and contact hole 20, then forming the second passivation layer 38 on the passivation layer 10 that includes the reflective electrode 37, then forming the contact hole 36, which communicates with the reflective electrode 37, in the second passivation layer 38, and then forming the pixel electrode 12 on the second passivation layer 38 that includes the contact hole 36. This completes a thin-film transistor array substrate similar to that shown in FIGS. 18 and 19.

It should be noted that FIGS. 18 and 19 illustrate an arrangement in which the reflective electrode 37 is provided in the layer between the passivation layer 10 and second passivation layer 38. However, it is permissible to adopt an arrangement in which the second passivation layer 38 of FIGS. 18 and 19 is eliminated and, as shown in FIGS. 20 and 21, the transmissive pixel electrode 12 is provided in the same layer as that of the reflective electrode 37 and the reflective electrode 37 is connected to a connecting portion 12g formed on the pixel electrode 12 (Example 5-1). In this case, the second passivation layer 38 and contact hole 36 of FIGS. 18, 19 are unnecessary.

In the arrangement of FIGS. 20 and 21, the reflective electrode 37 is formed at the position of a subpixel electrode, from among the three subpixel electrodes in one pixel region, connected to the source electrode 8 through the contact hole 20. However, the reflective electrode 37 may just as well be formed at the position of the middle subpixel electrode, as shown in FIG. 22 (Example 5-2), or at the position of the subpixel element that is most distant from the contact hole 20, as shown in FIG. 23 (Example 5-3).

In accordance with the fifth exemplary embodiment, advantages similar to those of the third exemplary embodiment are obtained. In addition, since a reflective pixel electrode (reflective electrode 37) is provided in one pixel region, it is possible for the device to operate as a so-called translucent liquid crystal display device. As a result, an excellent display can be implemented in both bright and dark surroundings.

As many apparently widely different embodiments of the present invention can be made without departing from the spirit and scope thereof, it is to be understood that the invention is not limited to the specific embodiments thereof except as defined in the appended claims.

What is claimed is:

1. A thin-film transistor array substrate comprising:
   an etching-stop layer formed on an insulating layer;
   a passivation layer formed on the insulating layer that includes said etching-stop layer;
   a depression formed in said passivation layer and hollowing the passivation layer to the surface of said etching-stop layer; and
   a pixel electrode, which is recessed in conformity with said depression, formed on said passivation layer including said depression;
   wherein said etching-stop layer is made of a transparent semiconductor formed in the same layer as channels of thin film transistors.

2. The substrate according to claim 1, further comprising:
   a transparent insulating substrate;
   a scanning line formed on said transparent insulating substrate;
   a gate electrode formed on said transparent insulating substrate and branching from said scanning line;
   an insulating layer formed on said transparent insulating substrate including said gate electrode and said scanning line;
   a transparent semiconductor layer formed on said insulating layer in an area which will become a channel of said gate electrode;
   a signal line formed on said insulating layer and intersecting said scanning line;
   a drain electrode formed on said insulating layer, branching from said signal line and connected to one end of said transparent semiconductor layer;
   a source electrode formed on said insulating layer, which lies in the same layer as that of said drain electrode, and connected to the other end of said transparent semiconductor layer; and
   a contact hole formed in said passivation layer and communicating with said source electrode;
   wherein said etching-stop layer lies in the same layer and consists of the same material as that of said transparent semiconductor layer;
   said passivation layer is formed on said insulating layer that includes said transparent semiconductor layer, said etching-stop layer, said signal line, said drain electrode and said source electrode;
   said depression is formed in said passivation layer in an area surrounded by said scanning line and said signal line; and
   said pixel electrode is formed on said passivation layer at least in the area surrounded by said scanning line and said signal line and is electrically connected to said source electrode through said contact hole.

3. The substrate according to claim 2, wherein said depression is formed at the center of the area surrounded by said scanning line said signal line.

4. The substrate according to claim 1, wherein said etching-stop layer is disposed in region substantially identical with a region of the pixel electrode.

5. A thin-film transistor array substrate comprising:
   a pixel protrusion formed on an insulating layer;
   a passivation layer formed on the insulating layer that includes said pixel protrusion and, having a first projecting portion projecting in the vertical direction against the insulating layer and corresponding to said pixel protrusion; and
   a pixel electrode formed on said passivation layer that includes the first projecting portion and, having a second projecting portion projecting in the vertical direction against the insulating layer and corresponding to the first projecting portion;
   wherein said pixel protrusion comprises a transparent semiconductor.

6. A thin-film transistor array substrate comprising:
   a pixel protrusion formed on an insulating layer;
   a passivation layer formed on the insulating layer that includes said pixel protrusion and, having a first projecting portion projecting in the vertical direction against the insulating layer and corresponding to said pixel protrusion; and
   a pixel electrode formed on said passivation layer that includes the first projecting portion and, having a second projecting portion projecting in the vertical direction against the insulating layer and corresponding to the first projecting portion;
   wherein said pixel protrusion comprises a transparent semiconductor, and
   wherein said pixel protrusion is formed into a shape having a plurality of projections extending radially outward from the center.

7. The substrate according to claim 5, wherein said pixel electrode has a structure in which a plurality of subpixel electrodes are joined to one another, and said pixel protrusion is disposed for every subpixel electrode.

8. The substrate according to claim 2, wherein a portion of said pixel electrode is disposed also in an area overlapped by the scanning line.

9. The substrate according to claim 1, wherein said pixel electrode is formed to have a plurality of slits in the circumferential portion thereof.

10. The substrate according to claim 1, wherein said pixel electrode is a transmissive pixel electrode.

11. A liquid crystal display device comprising:
    the thin-film transistor array substrate set forth in claim 1;
    a color filter substrate; and
    a liquid crystal layer interposed between said thin-film transistor substrate array and said color filter substrate.

12. The device according to claim 11, wherein said liquid crystal layer is a layer comprising vertically aligned liquid crystal molecules.

13. A method of manufacturing a thin-film transistor array substrate, comprising:
    forming a gate electrode and a scanning line on a transparent insulating substrate;

forming an insulating layer on the transparent insulating substrate that includes the gate electrode and the scanning line;

forming a transparent semiconductor layer on the insulating layer in an area which will become a channel of the gate electrode, and simultaneously forming on the insulating layer an etching-stop layer consisting of a material identical with that of the transparent semiconductor layer;

forming at least a drain electrode, a source electrode and a signal line on the insulating layer;

forming a passivation layer on the insulating layer that includes the transparent semiconductor layer, the etching-stop layer, the signal line, the drain electrode and the source electrode;

forming a depression, hollows the passivation layer to the surface of the etching-stop layer, in the passivation layer, and simultaneously forming a contact hole that communicates with the source electrode; and forming a pixel electrode on the passivation layer that includes areas of the depression and the contact hole.

* * * * *